(12) United States Patent
Huang

(10) Patent No.: US 11,043,424 B2
(45) Date of Patent: Jun. 22, 2021

(54) INCREASE THE VOLUME OF EPITAXY REGIONS

(71) Applicant: Taiwan Semiconductor Manufacturing Company, Ltd., Hsinchu (TW)

(72) Inventor: Yu-Lien Huang, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/177,889

(22) Filed: Nov. 1, 2018

(65) Prior Publication Data

US 2020/0043793 A1 Feb. 6, 2020

Related U.S. Application Data

(60) Provisional application No. 62/712,402, filed on Jul. 31, 2018.

(51) Int. Cl.
| | |
|---|---|
| *H01L 21/8234* | (2006.01) |
| *H01L 21/762* | (2006.01) |
| *H01L 29/66* | (2006.01) |
| *H01L 29/78* | (2006.01) |
| *H01L 21/02* | (2006.01) |
| *H01L 29/08* | (2006.01) |

(52) U.S. Cl.
CPC ........ *H01L 21/823431* (2013.01); *H01L 21/02293* (2013.01); *H01L 21/762* (2013.01); *H01L 21/823437* (2013.01); *H01L 21/823468* (2013.01); *H01L 21/823481* (2013.01); *H01L 29/0847* (2013.01); *H01L 29/6656* (2013.01); *H01L 29/66545* (2013.01); *H01L 29/66795* (2013.01); *H01L 29/785* (2013.01)

(58) Field of Classification Search
CPC ....... H01L 21/823431; H01L 29/66795; H01L 21/823468; H01L 29/66545; H01L 21/823437; H01L 29/785; H01L 21/762; H01L 29/6656; H01L 21/823481; H01L 29/0847; H01L 21/02293
See application file for complete search history.

(56) References Cited

U.S. PATENT DOCUMENTS

| | | | |
|---|---|---|---|
| 9,166,010 B2 | 10/2015 | Kelly et al. | |
| 9,935,199 B2 | 4/2018 | Ching et al. | |
| 10,163,635 B1 * | 12/2018 | Qi | .............. H01L 21/823431 |

(Continued)

FOREIGN PATENT DOCUMENTS

| | | |
|---|---|---|
| KR | 20140029094 A | 3/2014 |
| KR | 20170040723 A | 4/2017 |

(Continued)

*Primary Examiner* — Marcos D. Pizarro
*Assistant Examiner* — Sue Tang
(74) *Attorney, Agent, or Firm* — Slater Matsil, LLP

(57) ABSTRACT

A method includes forming a gate stack on a plurality of semiconductor fins. The plurality of semiconductor fins includes a plurality of inner fins, and a first outer fin and a second outer fin on opposite sides of the plurality of inner fins. Epitaxy regions are grown based on the plurality of semiconductor fins, and a first height of the epitaxy regions measured along an outer sidewall of the first outer fin is smaller than a second height of the epitaxy regions measured along an inner sidewall of the first outer fin.

20 Claims, 20 Drawing Sheets

(56) References Cited

U.S. PATENT DOCUMENTS

| | | | |
|---|---|---|---|
| 10,269,932 B1* | 4/2019 | Arya | H01L 21/823418 |
| 10,431,473 B2 | 10/2019 | Ching et al. | |
| 10,510,753 B2 | 12/2019 | Lee et al. | |
| 2014/0001520 A1* | 1/2014 | Glass | H01L 29/7833 |
| | | | 257/288 |
| 2014/0065782 A1* | 3/2014 | Lu | H01L 21/76224 |
| | | | 438/294 |
| 2015/0349085 A1 | 12/2015 | Liu et al. | |
| 2016/0149036 A1* | 5/2016 | Huang | H01L 29/7848 |
| | | | 257/401 |
| 2016/0268171 A1 | 9/2016 | Wei et al. | |
| 2016/0315172 A1 | 10/2016 | Wu et al. | |
| 2016/0329429 A1* | 11/2016 | Cheng | H01L 29/7851 |
| 2017/0069756 A1 | 3/2017 | Chiang et al. | |
| 2018/0151439 A1 | 5/2018 | Huang | |
| 2018/0151683 A1 | 5/2018 | Yeo et al. | |
| 2019/0096674 A1 | 3/2019 | Liao et al. | |

FOREIGN PATENT DOCUMENTS

| | | |
|---|---|---|
| TW | 201727898 A | 8/2017 |
| TW | 201812862 A | 4/2018 |

\* cited by examiner

INCREASE THE VOLUME OF EPITAXY REGIONS

PRIORITY CLAIM AND CROSS-REFERENCE

This application claims the benefit of the following provisionally filed U.S. Patent application: Application Ser. No. 62/712,402, filed Jul. 31, 2018, and entitled "Increase the Volume of Epitaxy Regions," which application is hereby incorporated herein by reference.

BACKGROUND

Technological advances in Integrated Circuit (IC) materials and design have produced generations of ICs where each generation has smaller and more complex circuits than the previous generations. In the course of IC evolution, functional density (for example, the number of interconnected devices per chip area) has generally increased while geometry sizes have decreased. This scaling down process generally provides benefits by increasing production efficiency and lowering associated costs.

Such scaling down has also increased the complexity of processing and manufacturing ICs, and for these advances to be realized, similar developments in IC processing and manufacturing are needed. For example, Fin Field-Effect Transistors (FinFETs) have been introduced to replace planar transistors. The structures of FinFETs and the methods of fabricating FinFETs are being developed.

FinFETs are formed based on semiconductor fins. The source and drain regions of FinFETs may be formed by etching some portions of semiconductor fins on opposite sides of gates, and then growing suitable materials in the spaces left by the etched portions of semiconductor fins.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
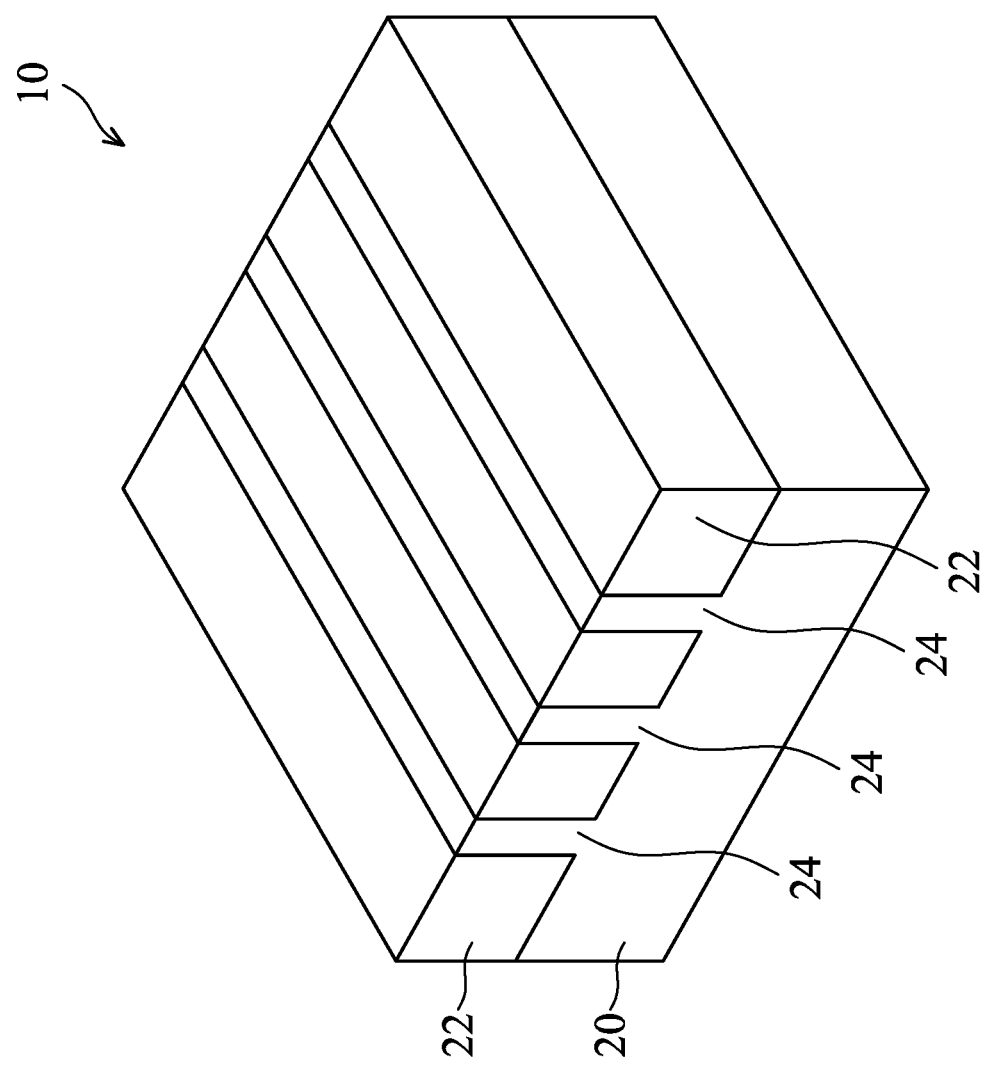
FIGS. 1 through 3, 4A, 4B-1 through 4B-5, 5A, 5B, 6 through 9, and 10A illustrate the cross-sectional views and perspective views of intermediate stages in the formation of a Fin Field-Effect Transistor (FinFET) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and the methods of forming the same are provided in accordance with some embodiments. The intermediate stages of forming the FinFETs are illustrated in accordance with some embodiments. Some variations of some embodiments are discussed. Throughout various views and illustrative embodiments, like reference numbers are used to designate like elements. In accordance with some embodiments, fin spacers of FinFETs are formed to have different heights, with the heights of the outer fin spacers being greater than the height of the inner fin spacers. As a result, the volume of the epitaxy regions between the fins is increased, and the strain applied by the epitaxy regions is increased. The risk of bridging the epitaxy regions of neighboring FinFETs is also reduced.

Figure 13:
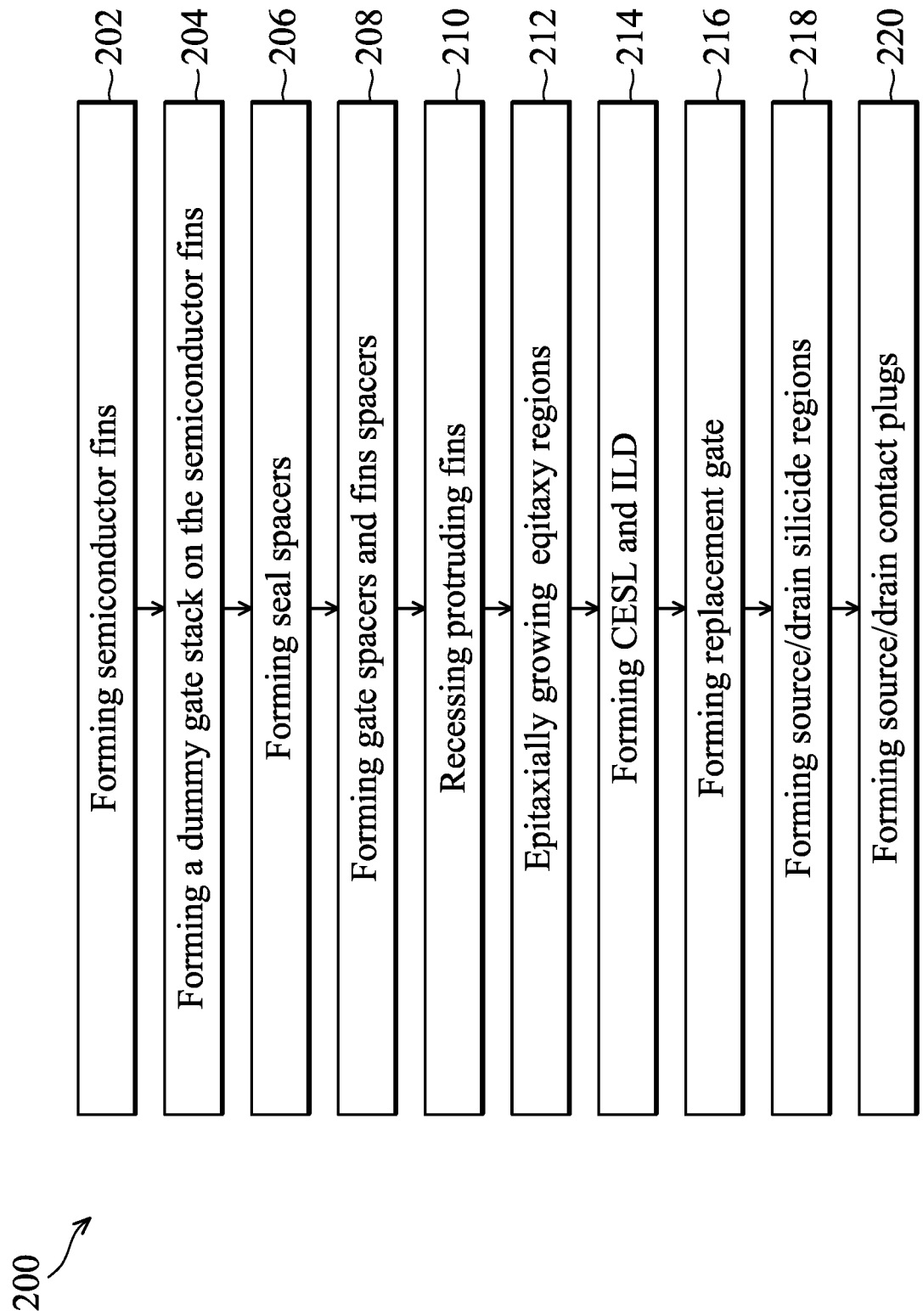
FIG. 13 illustrates a process flow for forming FinFETs in accordance with some embodiments.

FIGS. 1 through 3, 4A, 4B-1 through 4B-5, 5A, 5B, 6 through 9, and 10A illustrate the perspective views and cross-sectional views of intermediate stages in the formation of a FinFET in accordance with some embodiments of the present disclosure. The steps shown in the corresponding figures are also reflected schematically in the process flow shown in FIG. 13.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The portions of substrate 20 between neighboring STI regions 22 are referred to as semiconductor strips 24. The top surfaces of semiconductor strips 24 and the top surfaces of STI regions 22 may be substantially level with each other in accordance with some embodiments.

STI regions 22 may include a dielectric liner (not shown), which may be formed of silicon oxide, silicon nitride, or the like. The dielectric liner may be deposited using, for example, Atomic Layer Deposition (ALD), High-Density Plasma Chemical Vapor Deposition (HDPCVD), or Chemical Vapor Deposition (CVD). STI regions 22 may also include a dielectric material (silicon oxide, for example)

over the dielectric liner, wherein the dielectric material may be formed using Flowable Chemical Vapor Deposition (FCVD), spin-on, or the like.

Figure 2:
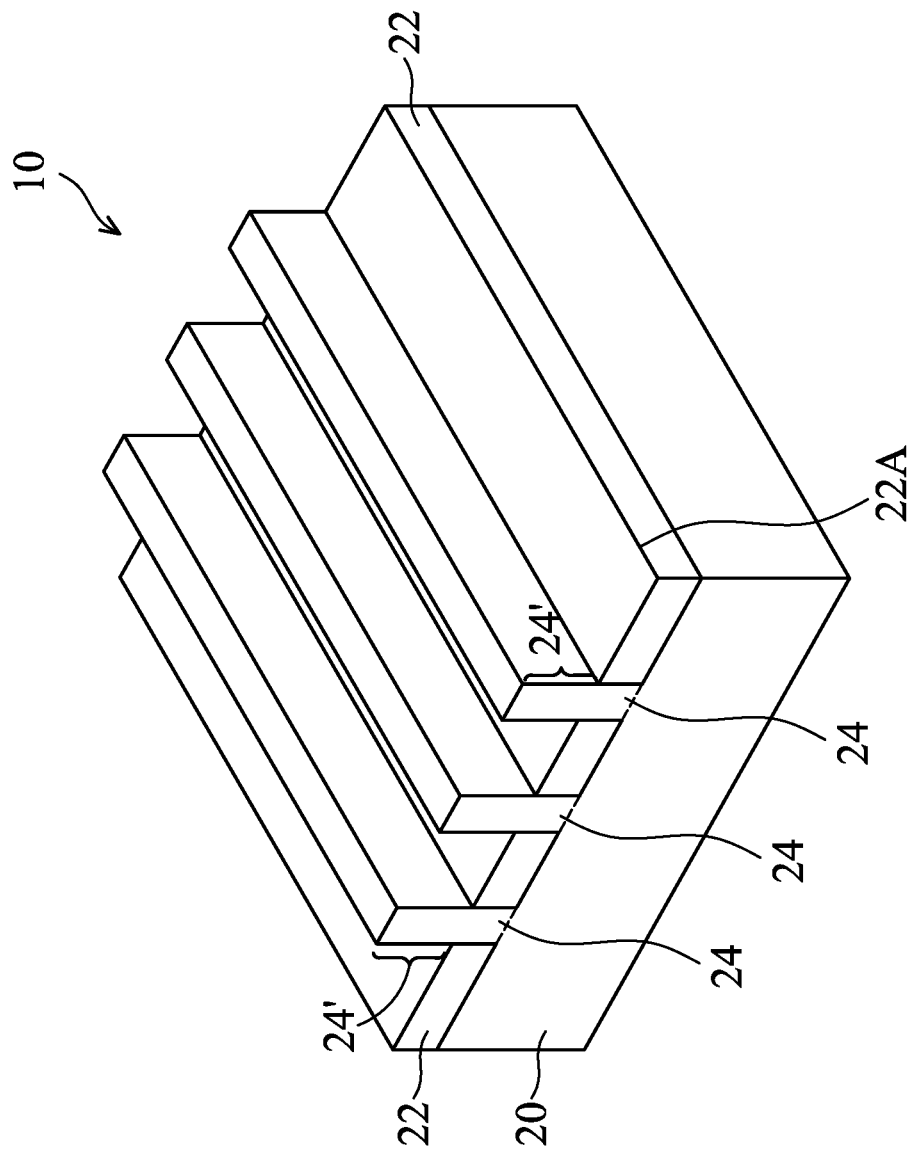

Referring to FIG. 2, STI regions 22 are recessed, so that the top portions of semiconductor strips 24 protrude higher than the top surfaces 22A of STI regions 22 to form protruding fins 24'. The respective process is illustrated as process 202 in the process flow shown in FIG. 13. The portions of semiconductor strips 24 in STI regions 22 are still referred to as semiconductor strips. The etching may be performed using a dry etching process, wherein a mixture of HF and NH$_3$ may be used as the etching gases. The etching may also be performed using a mixture of NF$_3$ and NH$_3$ as the etching gases. During the etching process, plasma may be generated. Argon may also be included. In accordance with alternative embodiments of the present disclosure, the recessing of STI regions 22 is performed using a wet etch process. The etching chemical may include HF solution, for example.

In accordance with some embodiments, the fins for forming the FinFETs may be formed/patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 3:
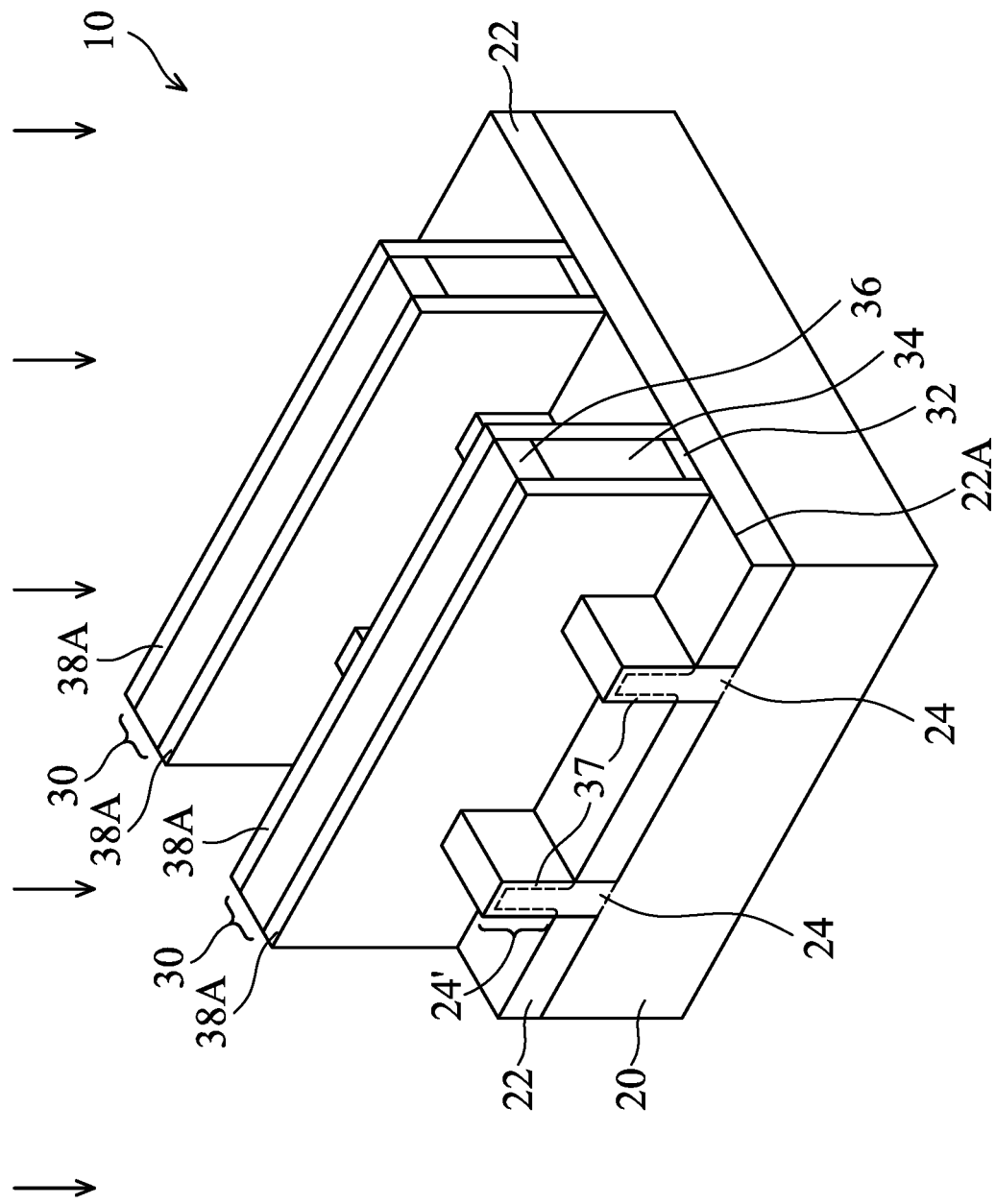

Referring to FIG. 3, dummy gate stacks 30 are formed on the top surfaces and the sidewalls of protruding fins 24'. The respective process is illustrated as process 204 in the process flow shown in FIG. 13. It is appreciated that although two dummy gate stacks 30 are illustrated for clarity, there may be a single or more than two dummy gate stacks formed, which are parallel to each other, with the plurality of dummy gate stacks crossing the same semiconductor fin(s) 24'. Dummy gate stacks 30 may include dummy gate dielectrics 32 and dummy gate electrodes 34 over dummy gate dielectrics 32. Dummy gate electrodes 34 may be formed using, for example, amorphous silicon or polysilicon, and other materials may also be used. Each of dummy gate stacks 30 may also include one (or a plurality of) hard mask layer 36 over dummy gate electrode 34. Hard mask layers 36 may be formed of silicon nitride, silicon carbo-nitride, or the like. Dummy gate stacks 30 also have lengthwise directions perpendicular to the lengthwise directions of protruding fins 24'.

Next, seal spacers 38A are formed on the sidewalls of dummy gate stacks 30. The respective process is illustrated as process 206 in the process flow shown in FIG. 13. In accordance with some embodiments of the present disclosure, seal spacers 38A are formed of a dielectric material such as silicon oxide, silicon carbon-oxynitride (SiCN), silicon nitride, or the like. The formation of seal spacers 38A may include depositing a conformal dielectric layer using a conformal deposition method such as ALD, CVD, or the like, and then performing an anisotropic etch to remove the portions on the top and sidewalls of fins 24'.

After the formation of seal spacers 38A, an implantation may be performed to implant an n-type impurity or a p-type impurity to form Lightly Doped Drain/source (LDD) regions 37 in the exposed protruding fins 24'. For example, when the respective FinFET to be formed is an n-type FinFET, an n-type impurity such as phosphorous, arsenic, or the like may be implanted. When the respective FinFET to be formed is a p-type FinFET, a p-type impurity such as boron, indium, gallium, or the like may be implanted. In subsequent drawings, LDD regions 37 are not illustrated while they may still exist.

Figure 4A:
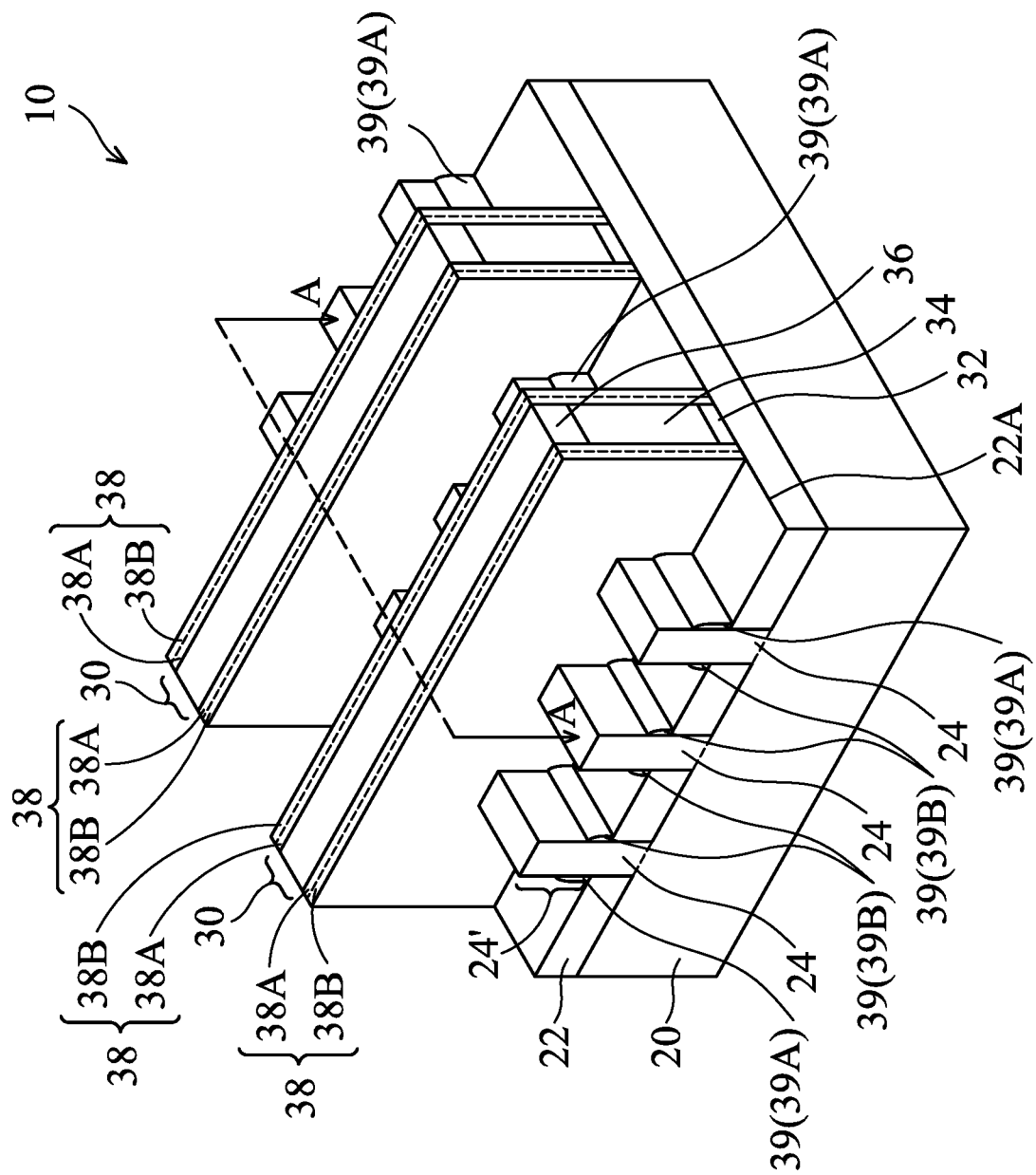

FIG. 4A illustrates the formation of gate spacers 38B and fin spacers 39. The respective process is illustrated as process 208 in the process flow shown in FIG. 13. Gate spacers 38B are formed on seal spacers 38A. In accordance with some embodiments of the present disclosure, gate spacers 38B are multi-layer gate spacers, and the formation process may include blanket depositing a first dielectric layer and a second dielectric layer over the first dielectric layer, and then performing anisotropic etches to remove the portions of the first and the second dielectric layers on the top and sidewalls of fins 24'. The remaining portions of the dielectric layers are gate spacers 38B. Seal spacers 38A and gate spacers 38B are in combination referred to as gate spacers 38 hereinafter.

FIG. 4A also illustrates fin spacers 39 formed on the sidewalls of protruding fins 24'. In accordance with some embodiments of the present disclosure, fin spacers 39 and gate spacers 38B are formed simultaneously in common formation processes. For example, in the process for forming gate spacers 38B, the blanket dielectric layer(s) that are deposited for forming gate spacers 38B, when etched, may have some portions left on the sidewalls of protruding fins 24', hence forming fin spacers 39.

Figures 1, 4B:
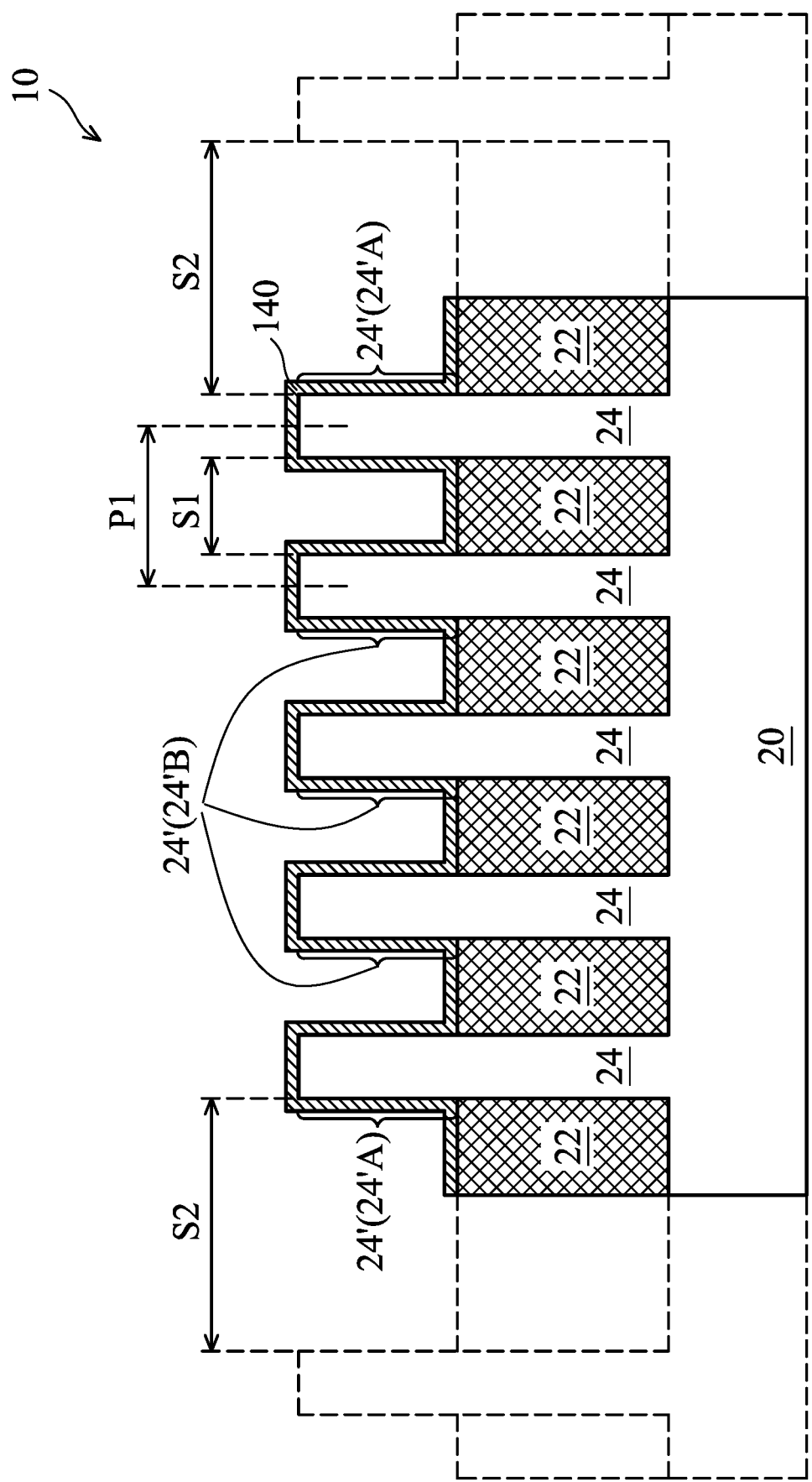
Figures 2, 4B:
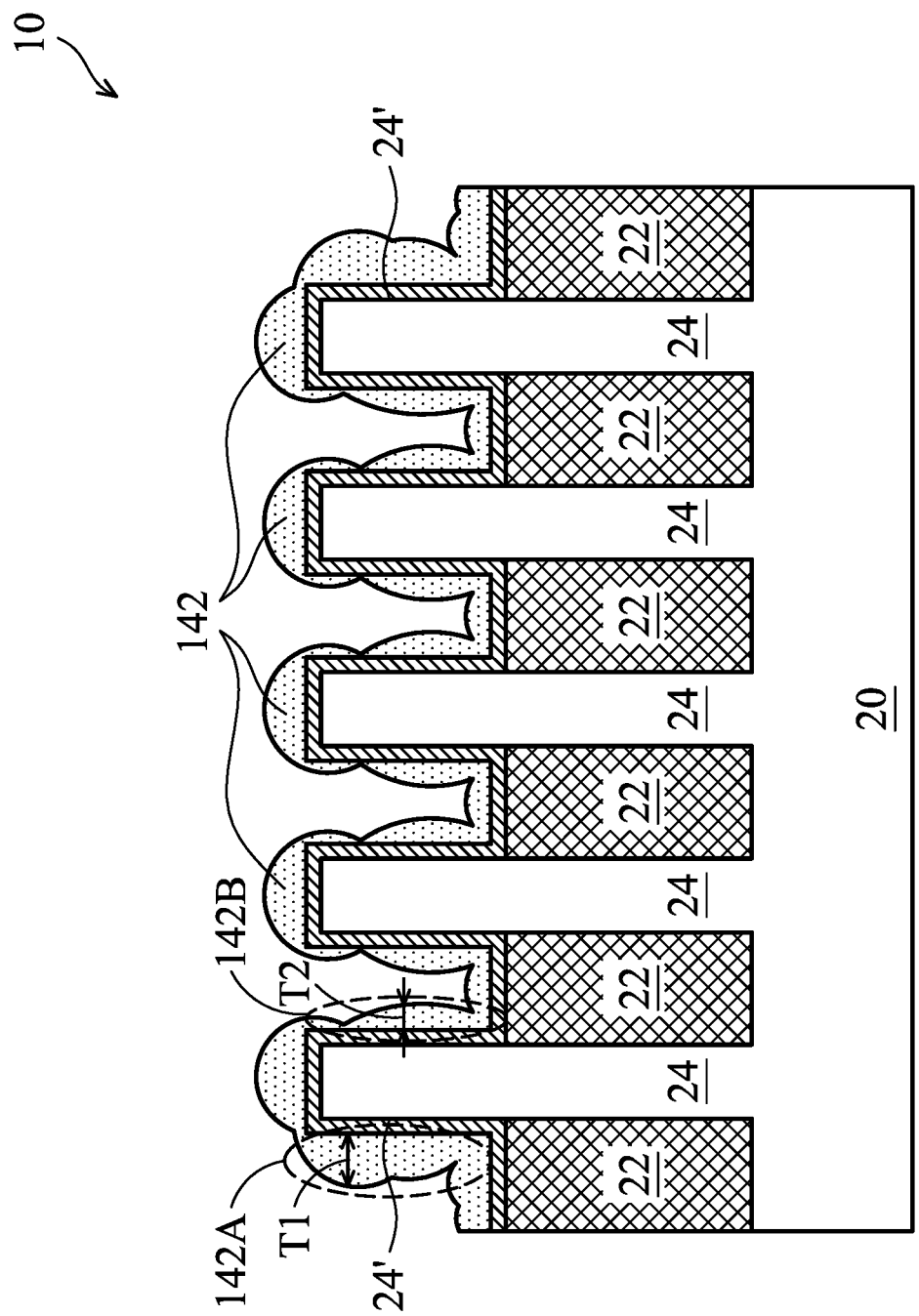
Figures 3, 4B:
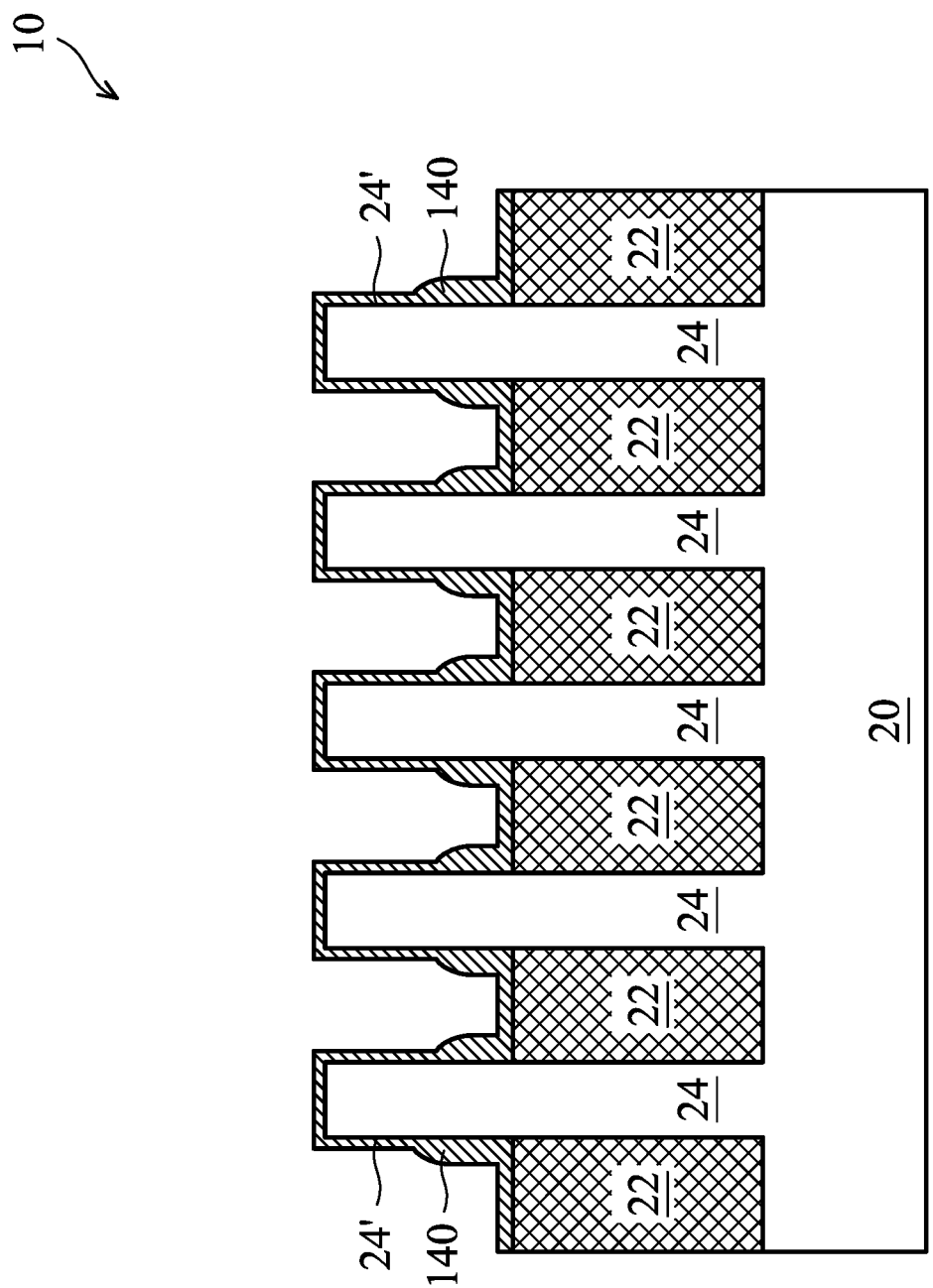

FIGS. 4B-1 through 4B-5 illustrate the cross-sectional views of intermediate stages in the formation of fin spacers 39 in accordance with some embodiments. The cross-sectional views in FIGS. 4B-1 through 4B-5 are obtained from the vertical plane containing line A-A in FIG. 4A. Gate spacers 38B are formed simultaneously, and are not shown since gate spacers 38B are in different planes than shown in FIGS. 4B-1 through 4B-5. Referring to FIG. 4B-1, spacer layer 140 is formed, which may be formed as a conformal layer. Spacer layer 140 is formed of a dielectric material such as silicon nitride, silicon oxide, silicon oxynitride, silicon carbo-nitride, silicon oxy-carbo-nitride, or the like. Spacer layer 140 includes some portions on the top surfaces and the sidewalls of protruding fins 24', and also includes some portions on seal spacers 38A and on the top surfaces of dummy gate stacks 30. Spacer layer 140 may have a thickness in the range between about 2 nm and about 10 nm. The protruding fins 24' as illustrated are closely located to form a fin group. The protruding fins that are used for forming the same FinFET may be in a same fin group, which fin group is spaced apart from the fin group of neighboring FinFETs. The distance S1 between the protruding fins 24' in the fin group is smaller than the distances S2 between the immediate neighboring fin groups (or between a fin group and a neighboring discrete fin). For example, ratio S2/S1 may be greater than about 2.0 or greater than about 5.0. The protruding fins 24' may have a uniform pitch P1. Throughout the description, the two outmost fins 24' (marked as 24'A) in the fin group are referred to as the outer fins of the fin group, and the fins 24'B between the outer fins 24'A are referred to as inner fins of the fin group.

Figures 4, 4B:
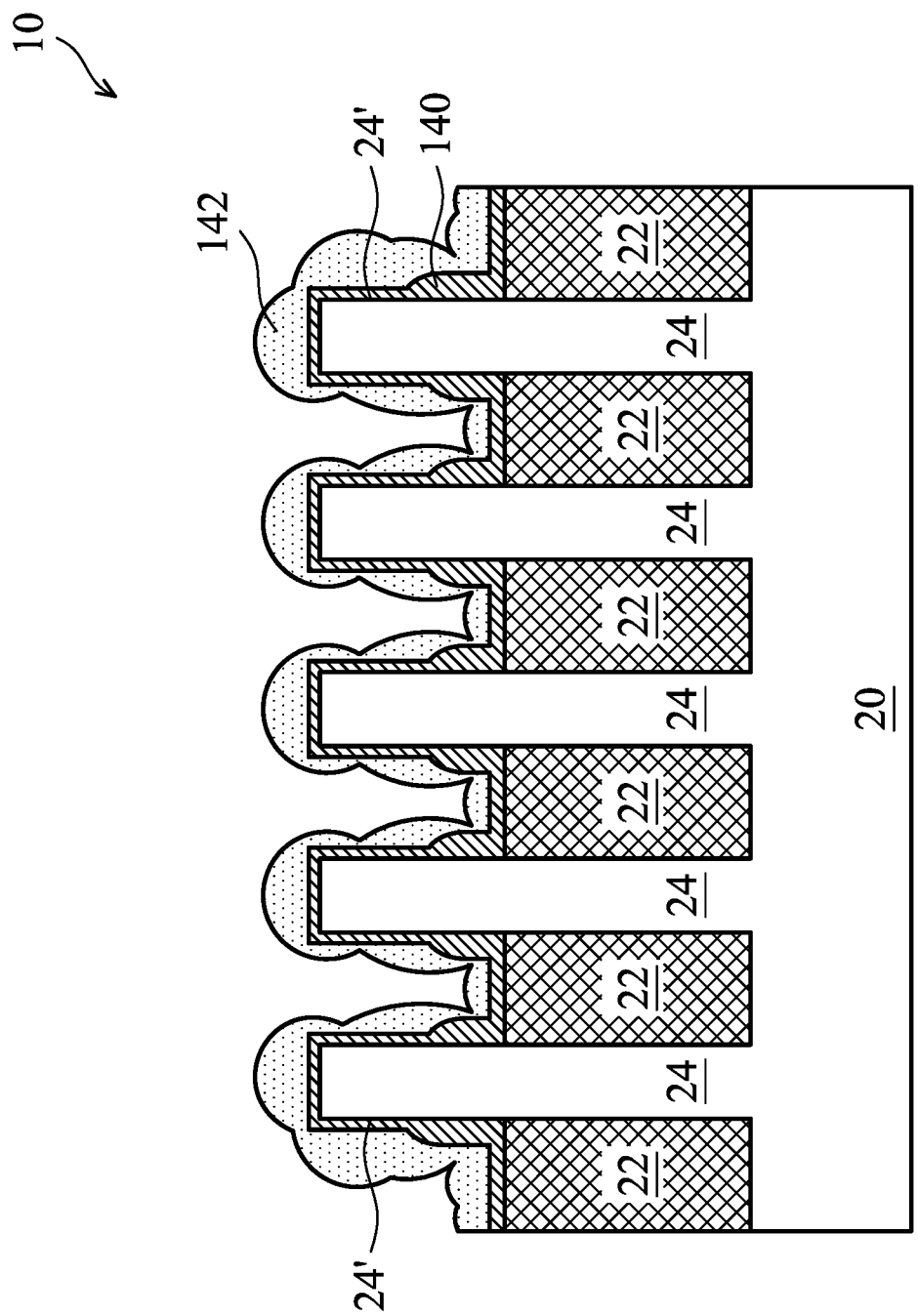
Figures 4, 4B, 5:
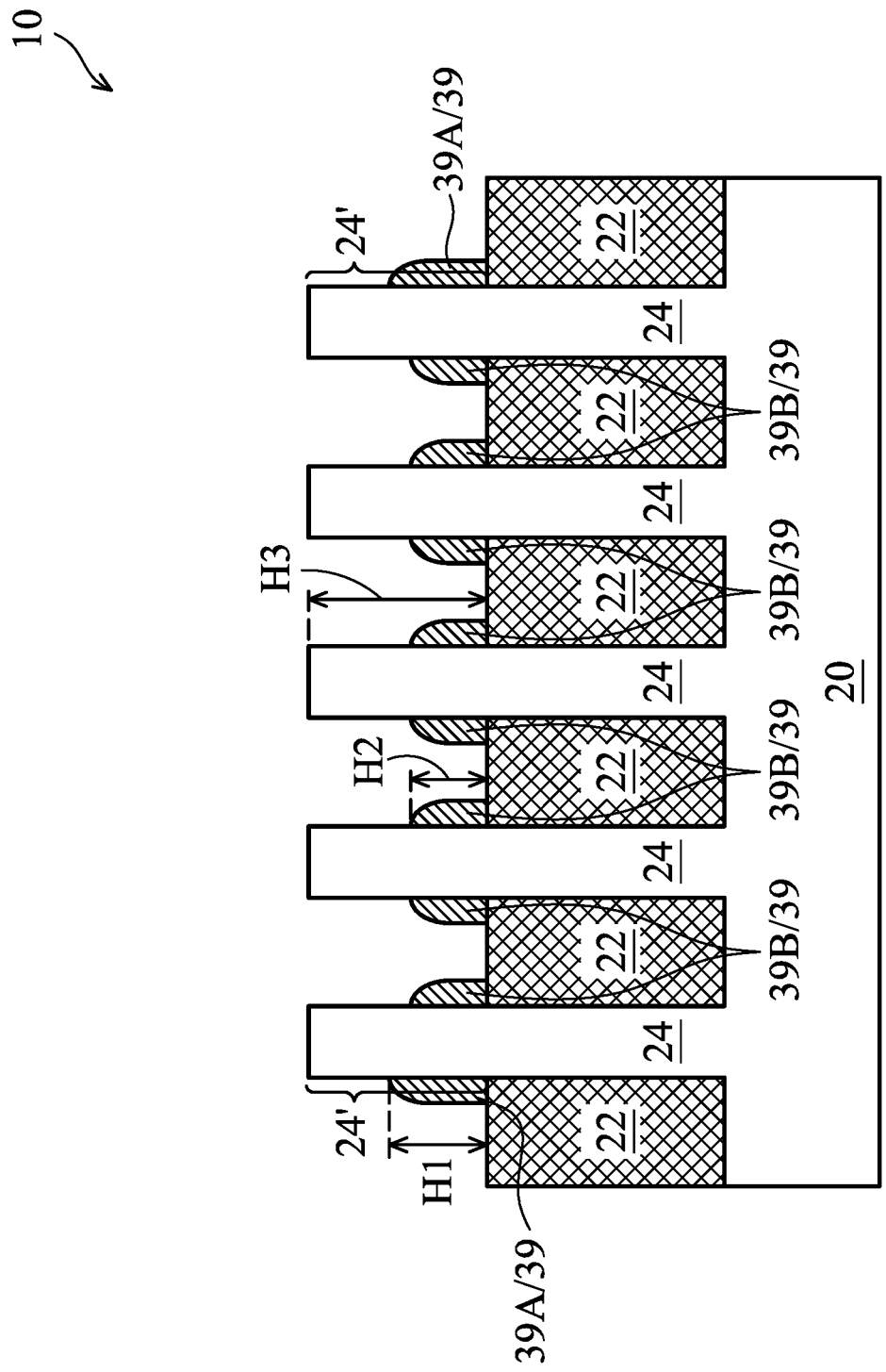

An anisotropic etching is then performed to etch spacer layer 140. In accordance with some embodiments of the present disclosure, the etching process is controlled to result in the fin spacers 39 (including 39A and 39B) to have the profiles as shown in FIG. 4B-5. Fin spacers 39A, which are on the outer sides of the fin group, are referred to as outer fin spacers (of the fin group) hereinafter, and spacers 39B, which are inside the fin group and between the protruding fins 24' in the fin group, are referred to as inner spacers (of the fin group) hereinafter. In accordance with some embodiments, outer spacers 39A have height H1 greater than the height H2 of inner spacers 39B. Height difference (H1–H2) may be greater than about 10 nm, and may be in the range between about 30 nm and about 80 nm. The height difference (H1–H2) may also be greater than about 2.5 percent of height H3 of protruding fins 24'.

To achieve a desirable height difference (H1-H2), the etching process conditions are controlled, which process conditions include the composition of etching gases, the power used for the etching, and the like. As a result, spacer layer 140 (FIG. 4B-1) is etched. Referring to FIG. 4B-2, in the etching process, a layer 142 such as carbon-containing layer is also formed.

Layer 142 may be a polymer layer, and hence is referred to as polymer layer 142 hereinafter. Polymer layer 142 may comprise $C_xF_y$, wherein x and y are integers. In accordance with some embodiments of the present disclosure, the outer portions of polymer 142, which outer portions are on the outer sides of the fin group, have thickness T1, and the inner portions of polymer layer 142, which are in the fin group, have thickness T2 smaller than thickness T1. Ratio T1/T2 may be greater than about 1.1, and may be in the range between about 1.1 and about 5. As a result, the etching rate of the outer portions is lower than the etching rate of the inner portions due to the protection of polymer layer 142.

In accordance with some embodiments of the present disclosure, the etching gas may include the elements that are mainly used etching and the elements that are mainly used for forming a polymer. In accordance with some embodiments, the etching gas includes $CH_3F$, $CH_2F_2$, $CHF_3$, or the combinations thereof. The fluorine in the etching gas functions for etching, and the carbon and fluorine in the etching gas functions for forming polymers. In subsequent discussion, carbon is referred to as the polymer forming gas, although fluorine also functions partially as polymer forming gas. Accordingly, each of $CF_4$, $CH_3F$, $CH_2F_2$, $CHF_3$ may act as both the etching gas and the polymer forming gas in accordance with some embodiments. In accordance with other embodiments, the etching gas and the polymer-forming gas may be different gases. The relative amount of the etching gas (containing fluorine, for example) to the polymer-forming gas (containing carbon, for example) affects the etching behavior. For example, since the inner space between protruding fins 24' in the same fin group is smaller than the distances between fin groups, there are (fin pattern) iso regions (the spaces between fin groups) and (fin pattern) dense regions (the spaces between fins 24' in the same fin group). During the etching of spacer layer 140, spacer layer 140 tends to have higher etching rates in the iso regions than in the dense regions since it is easier for the etching gas to access the iso regions than the dense regions. Similarly, polymers tend to have a higher accumulation rate in the iso regions than in the dense regions since it is easier for the polymer-formation gases to access the iso regions than the dense regions. Polymer can protect spacer layer 140 from being etched, and can reduce the etching rate of spacer layer 140. Accordingly, the ratio of the etching gas to the polymer-forming gas (the ratio F/C when the aforementioned gases are used) is adjusted to result in more polymer to be generated on the outer portions of fin group than on the inner portions of the fin group, so that the etching rate of the outer portions of spacer layer 140 is reduced to a mount causing height H1 (FIG. 4B-5) to be greater than height H2.

For example, $CH_3F$ has a F/C ratio of 1, $CH_2F_2$ has a F/C ratio of 2, and $CHF_3$ has a F/C ratio of 3. Accordingly, $CHF_3$ may have a higher etching rate and a lower polymer accumulation rate than $CH_2F_2$, and $CH_2F_2$ may have a higher etching rate and a lower polymer accumulation rate than $CH_3F$. Mixing $CF_4$, $CH_3F$, $CH_2F_2$, and $CHF_3$ and selecting proper ratios of these gases may further adjust the F/C ratio. Also, in the etching gas, a small amount of other gases such as $H_2$ and $O_2$ may be added. $H_2$ may react with the fluorine in the etching gases, so that the amount of fluorine is reduced, the F/C ratio is reduced. $O_2$ may react with the carbon in the etching gases, so that the amount of carbon is reduced, the F/C ratio is increased. It is appreciated that the mechanism and the factors of etching is complicated, and the actual etching rate and polymer accumulation rate is affected by various factors. For example, since fluorine also functions as a polymer forming gas, this causes the increase in fluorine to affect both the etching rate and the polymer forming rate. Accordingly, increasing the F/C ratio may not always lead to the thickness ratio T1/T2 (of polymer 142) to be increased. Experiments may be performed to fine-tune the process conditions to achieve desirable etching rates and polymer accumulation rates in the iso and dense regions, and to achieve a desirable thickness ratio T1/T2 (FIG. 4B-2).

In addition, to increase the thickness ratio T1/T2, the main power and the bias power of the etching chamber, in which the etching is performed, is adjusted. For example, the etching chamber in which wafer 10 is placed for the etching of spacer layer 140 may have a main (RF) power, which may be provided through a coil and a main power source (not shown). The main power is to generate plasma from the etching gas. A bias voltage source may be connected to the chuck on which wafer 10 is placed to provide a bias power. The main power source and the bias voltage source are controlled by a control unit. When the main power is turned on and bias power is turned on also, spacer layer 140 is etched, and less polymer layer 142 (FIG. 4B-2) is generated. When the main power is turned on and bias power is turned off, the etching effect is significantly reduced and may be substantially eliminated, while polymer 142 is generated and accumulated. The bias power may be turned on and off (pulsed) to have a plurality of cycles, and the corresponding duty cycle (the ratio of on-time/(on-time+off-time) may be adjusted. For example, reducing the duty cycle may result in ratio H1/H2 (FIG. 4B-5) to be increased, and increasing the duty cycle may result in ratio H1/H2 to be reduced. Accordingly, by turning on and off the bias power and adjusting the duty cycle, the etching rates and polymer accumulation rates can be controlled to result in a desirable polymer thickness difference (T1–T2) (FIG. 4B-2), which affects the etching process to result in a desirable height difference (H1–H2) (FIG. 4B-5).

In addition to the pulsing of the bias voltage/power, the main power for generating plasma may also be pulsed (turned on and off with a plurality of cycles). The combined effect of the pulsing of the bias power and the main power may further tune the profile of the resulting fin spacers 39. The duty cycle of the main power and the bias power may be synchronized, which includes that the main power and the bias are turned on at the same time and turned off at the same time, or that the main power is turned on when the bias power is turned off and vice versa. Alternatively, the pulsing of the main power and the pulsing of the bias power may be applied in an unsynchronized mode.

In accordance with some embodiments, in the etching process, $CF_4$, $CH_3F$, $CH_2F_2$, $CHF_3$, $H_2$, CO, $O_2$, and combinations thereof may be used as the etching gas, and Ar and/or He may also be added. For example, an etching gas may include $CHF_3$ with a flow rate in the range between about 150 sccm and about 500 sccm and $CH_3F$ with a flow rate in the range between about 10 sccm and about 50 sccm. The chamber pressure may be in the range between about 3 mtorr and about 900 mtorr. $O_2$ may be provided with a flow rate in the range between about 5 sccm and about 50 sccm. The wafer temperature may be in the range between about −50° C. and about 200° C. The main (RF) power may be in the range between about 50 Watts and about 2,000 Watts, with either continuous plasma or plasma pulsing provided through the pulsing of the main power. When the pulsing is provided, the frequency of the pulsing may be in the range between about 0.01 KHz and about 10 KHz. The duty cycle of the main power may be in the range between about 10 percent and about 90 percent, and may be in the range between about 20 percent and about 60 percent. The bias power may be in the range between about 50 Watts and about 2,000 Watts, and may be applied continuously or with pulsing. When the pulsing is provided, the frequency of the pulsing may be in the range between about 0.01 KHz and about 10 KHz. The duty cycle of the bias power may be in the range between about 10 percent and about 90 percent, and may be in the range between about 20 percent and about 60 percent.

Referring again to FIG. 4B-2, there may be a plurality of duty cycles for the main power and the bias power, and hence there may be a plurality of cycles for accumulating polymer followed by etching spacer layer 140. In accordance with some embodiments of the present disclosure, after etching for a period of time, the accumulated polymer layer 142 is removed, for example, using $O_2$ gas. The resulting structure is shown in FIG. 4B-3, in which the top portions of spacer layer 140 have already been thinned.

The processes as described referring to FIGS. 4B-2 and 4B-3 may be repeated as cycles, which may range from 1 cycle to about 100 cycles. FIG. 4B-4 illustrates the accumulation of polymer layer 142 and the continued etching of spacer layer 140. As a result of the etching, fin spacers 39 are formed, as shown in FIG. 4B-5. The perspective view of the corresponding wafer 10 is also shown in FIG. 4A, which shows gate spacers 38B also.

After fin spacers 39 as shown in FIGS. 4A and 4B-5 are formed, an etching process (also referred to as a fin recessing process hereinafter) is performed to recess the portions of protruding fins 24' that are not covered by dummy gate stacks 30 and gate spacers 38, resulting in the structure shown in FIG. 5A. The respective process is illustrated as process 210 in the process flow shown in FIG. 13. The recessing may be anisotropic, and hence the portions of fins 24' directly underlying dummy gate stacks 30 and gate spacers 38 are protected from the etching. The top surfaces of the recessed semiconductor strips 24 may be lower than the top surfaces 22A of STI regions 22 in accordance with some embodiments. Recesses 40 are accordingly formed between STI regions 22. Recesses 40 are also located on the opposite sides of dummy gate stacks 30. The bottom surfaces of recesses 40 may be higher than the bottom surfaces 22B of STI regions 22, and lower than top surfaces 22A of STI regions 22. Fin spacers 39 are left after the formation of recesses 40.

Figure 12:
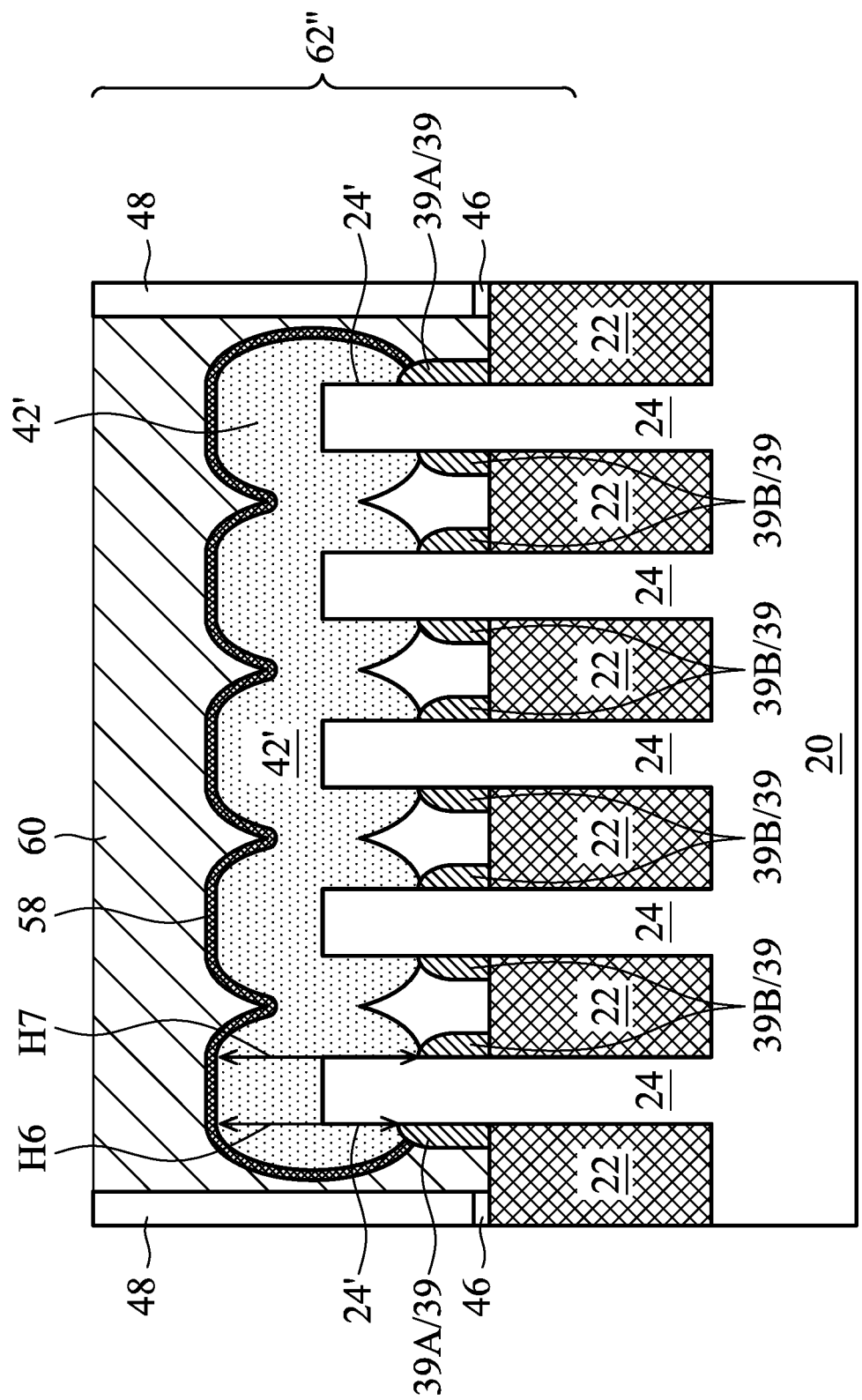
FIG. 12 illustrates the cross-sectional view of a FinFET having non-recessed fins in accordance with some embodiments.

In accordance with some embodiments, on the same wafer and the same device die as the wafer/die as shown in FIGS. 4A and 4B-5, some protruding fins 24' are not etched, and source/drain regions are formed based on the un-etched protruding fins 24'. For example, FIG. 12 illustrates the un-etched fins 24' and the corresponding source/drain regions. In accordance with some embodiments of the present disclosure, the fin recessing is performed on the protruding fins for p-type FinFETs, and no fin-recessing is performed on the protruding fins for n-type FinFETs.

In accordance with some embodiments of the present disclosure, the recessing is performed through a dry etching step. The dry etching may be performed using process gases such as $C_2F_6$, $CF_4$, $SO_2$, the mixture of HBr, $Cl_2$, and $O_2$, or the mixture of HBr, $Cl_2$, $O_2$, and $CF_2$, etc. In accordance with alternatively embodiments of the present disclosure, the recessing is performed through a wet etching step. The wet etching may be performed using KOH, tetramethylammonium hydroxide (TMAH), $CH_3COOH$, $NH_4OH$, $H_2O_2$, Isopropanol (IPA), or the solution of HF, $HNO_3$, and $H_2O$.

Figure 5A:
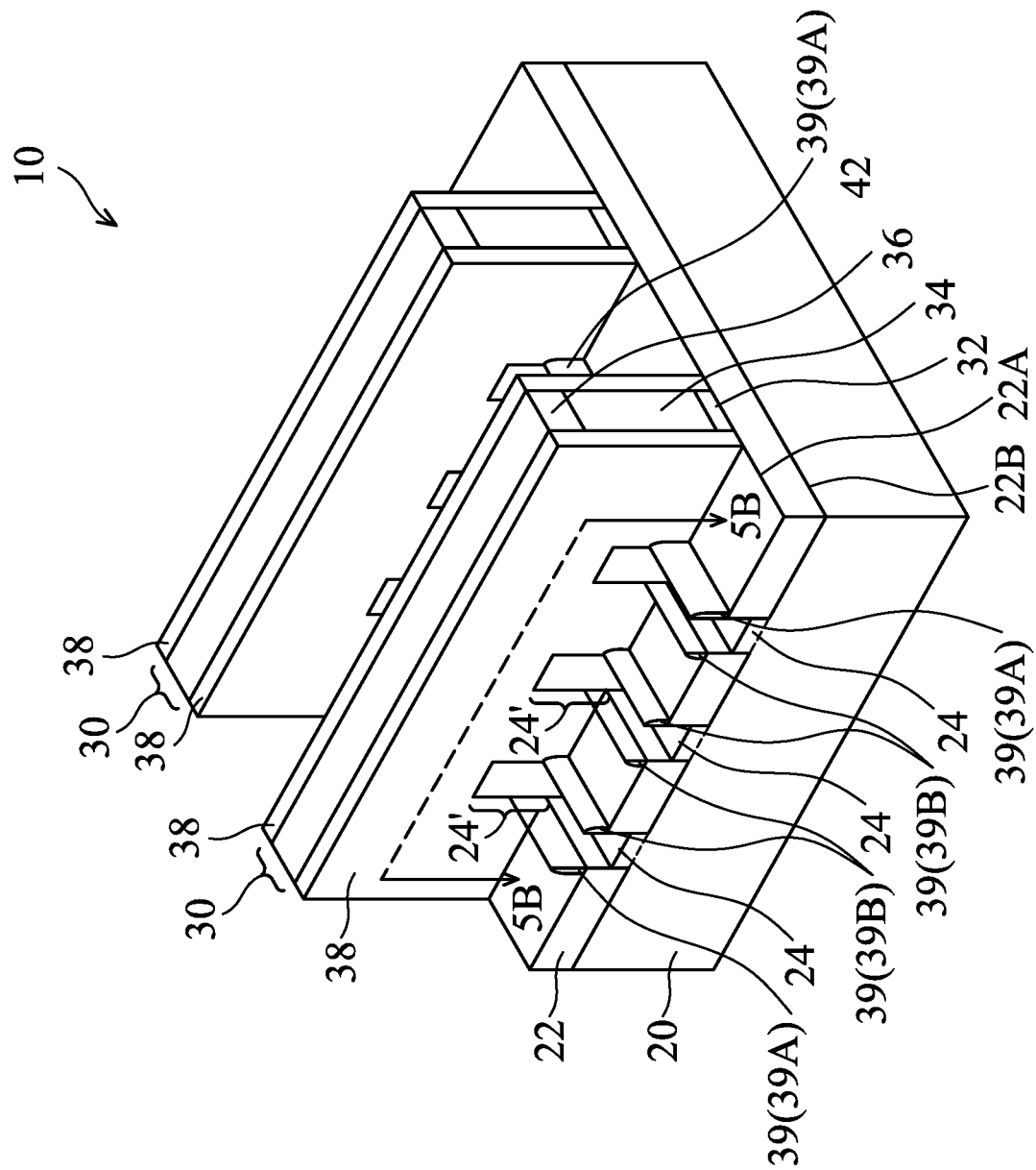
Figure 5B:
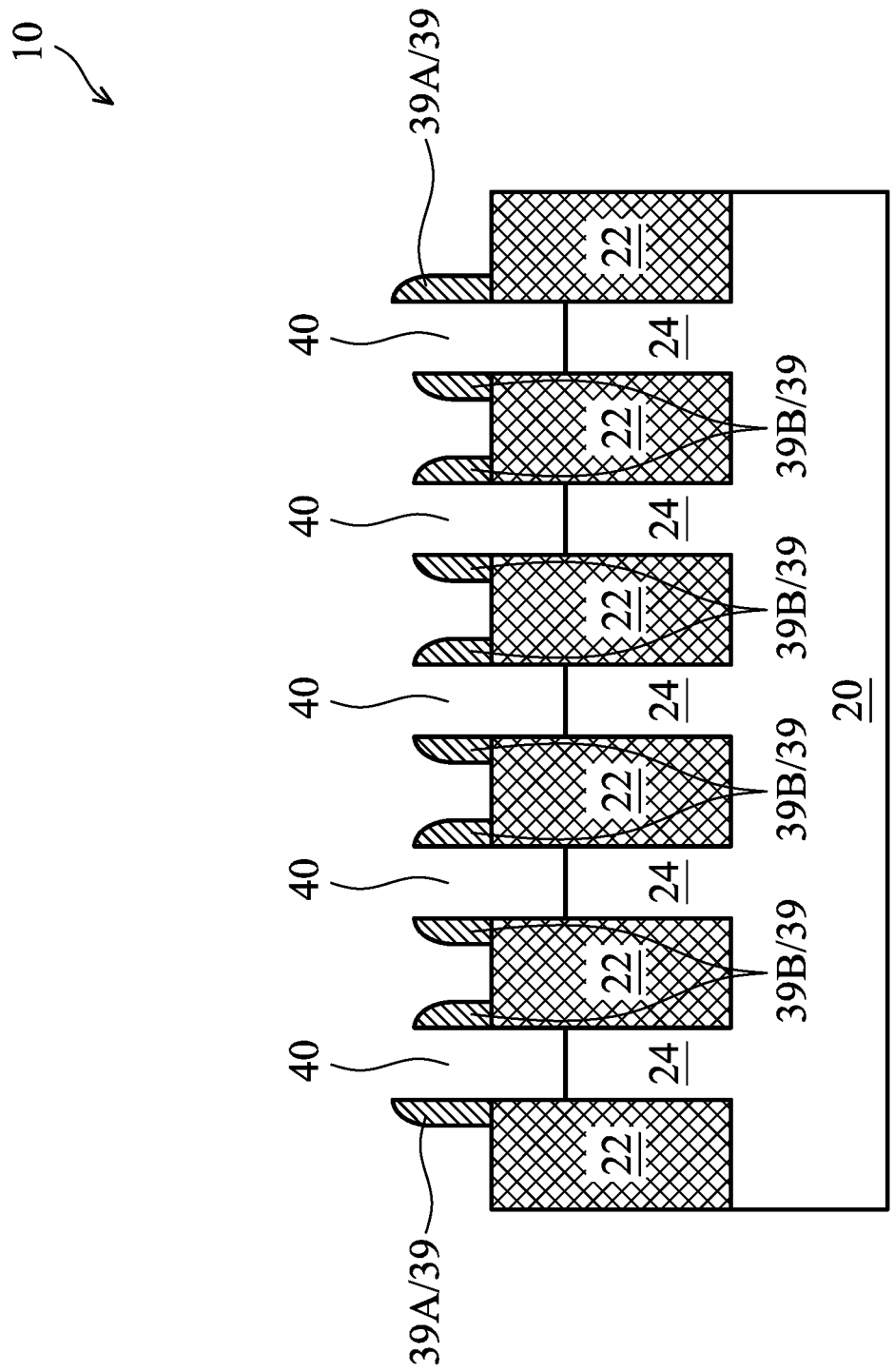

FIG. 5B illustrates a cross-sectional view of the structure shown in FIG. 5A, and the cross-sectional view is obtained from the vertical plane containing arrows 5B-5B in FIG. 5A. In accordance with some embodiments of the present disclosure, as shown in FIG. 5B, recesses 40 have substantially vertical edges, which are substantially flushed with the inner edges of fin spacers 39.

Figure 6:
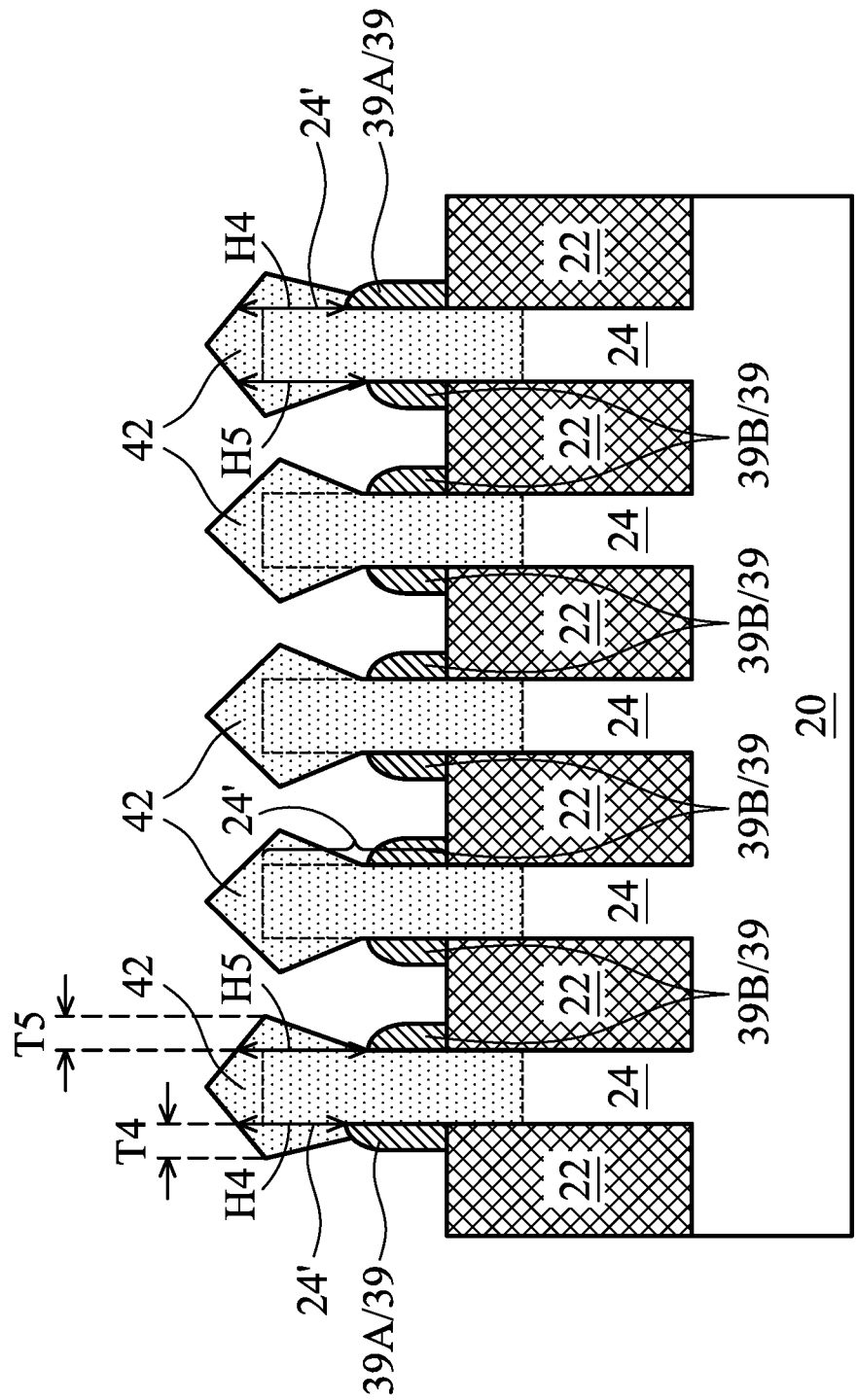

FIG. 6 illustrates the epitaxy processes for forming epitaxy regions 42. The respective process is illustrated as process 212 in the process flow shown in FIG. 13. Throughout the description, epitaxy regions 42 are also referred to as source/drain regions 42. Protruding fins 24', which are underlying gate stack 30 and hence are not in the illustrated plane, are marked using dashed lines. The formation methods of epitaxy regions 42 may include CVD, Plasma-Enhanced Chemical Vapor Deposition (PECVD), or the like. In accordance with some embodiments, epitaxy regions 42 include silicon germanium, silicon, or silicon carbon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), GeB, or the like may be grown, and epitaxy regions 42 are of p-type. Conversely, when the resulting FinFET is an n-type FinFET, silicon phosphorous (SiP), silicon carbon phosphorous (SiCP), or the like, may be grown, and epitaxy regions 42 are of n-type. In accordance with alternative embodiments of the present disclosure, epitaxy regions 42 are formed of a III-V compound semiconductor such as GaAs, InP, GaN, InGaAs, InAlAs, GaSb, AlSb, AlAs, AlP, GaP, combinations thereof, or multi-layers thereof. After epitaxy regions 42 fully fill recesses 40, epitaxy regions 42 start expanding horizontally, and facets may be formed. In accordance with some embodiments, the epitaxy processes for forming epitaxy regions 42 also comprise pulsing a bias voltage with a plurality of cycles. The pulsing may also have a duty cycle in a range between about 10 percent and about 90 percent.

When protruding fins 24' are not recessed before epitaxy regions 42 are formed, since outer spacers 39A are higher than inner spacers 39B, the outer sidewall surfaces of protruding fins 24' facing the inter-group spaces have smaller areas and heights than the inner sidewall surfaces of protruding fins 24' facing the inner-group spaces. Accordingly, the portions of epitaxy regions 42 grow from the inner sidewall surfaces have height H5 greater than height H4 of the portions of epitaxy regions 42 grow from the outer sidewall surfaces. When protruding fins 24' are recessed, similar results will occur. Heights H4 and H5 are the heights measured from the top ends of the respective fin spacers 39A and 39B vertically to the respective top surfaces of epitaxy regions 42. Alternatively stated, the height H4 is measured from the outer sidewall of the outmost protruding fin 24' vertically up, and height H5 is measured from the inner sidewall of the outmost protruding fin 24' vertically up. Although protruding fins 24' may not be in the illustrated plane (unless the plane is the outer sidewall of gate spacers 38B), the positions of protruding fins 24' can be determined. For example, if Transmission Electron Microscopy (TEM) images are made to capture the image of the cross-sectional view shown in FIG. 6, fins 24' are visible in the TEM images.

In accordance with some embodiments, height H5 is greater than height H4. Height difference (H5−H4) may be greater than about 2 nm, and may be in the range between about 2 nm and about 10 nm. Also, thickness T4 of the portions of epitaxy regions 42 grown from the outer sidewall surfaces of protruding fins 24' is smaller than thickness T5 of the portions of epitaxy regions 42 grown from the inner sidewall surfaces of protruding fins 24'. Thickness difference (T5−T4) may be greater than about 2 nm, and may be in the range between about 2 nm and about 10 nm. With thickness T4 being small, the likelihood of the bridging of epitaxy region 42 to the epitaxy region 42 of the nearest neighboring FinFET is reduced.

In accordance with some embodiments, the formation of epitaxy regions 42 is finished when the epitaxy regions 42 grown from different fins 24' are spaced apart from each other, and forming un-merged source/drain epitaxy regions 42 in the Final FinFET. Accordingly, the epitaxy regions 42 as shown in FIG. 6 reflect the structure in the corresponding final FinFET. In accordance with alternative embodiments, epitaxy regions 42 are further grown to result in the structure shown in FIG. 7. The corresponding outer height and inner height of epitaxy regions 42 are referred to as H4' and H5'. In accordance with some embodiments, height H5' is greater than height H4'. Height difference (H5'−H4') may be greater than about 2 nm, and may be in the range between about 2 nm and about 8 nm. Air gaps 43 are formed between neighboring fin spacers 39.

Figure 7:
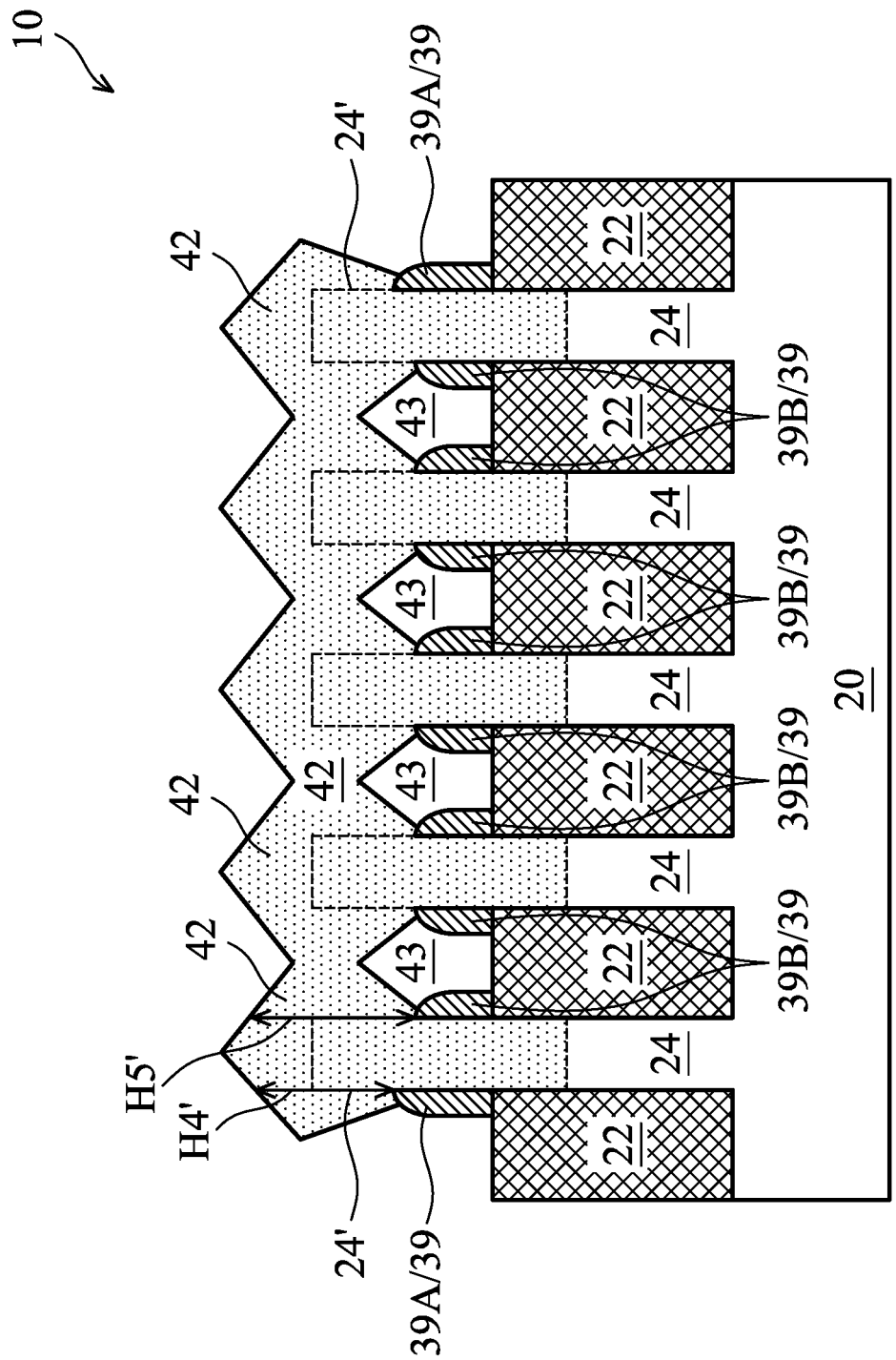
Figure 8:
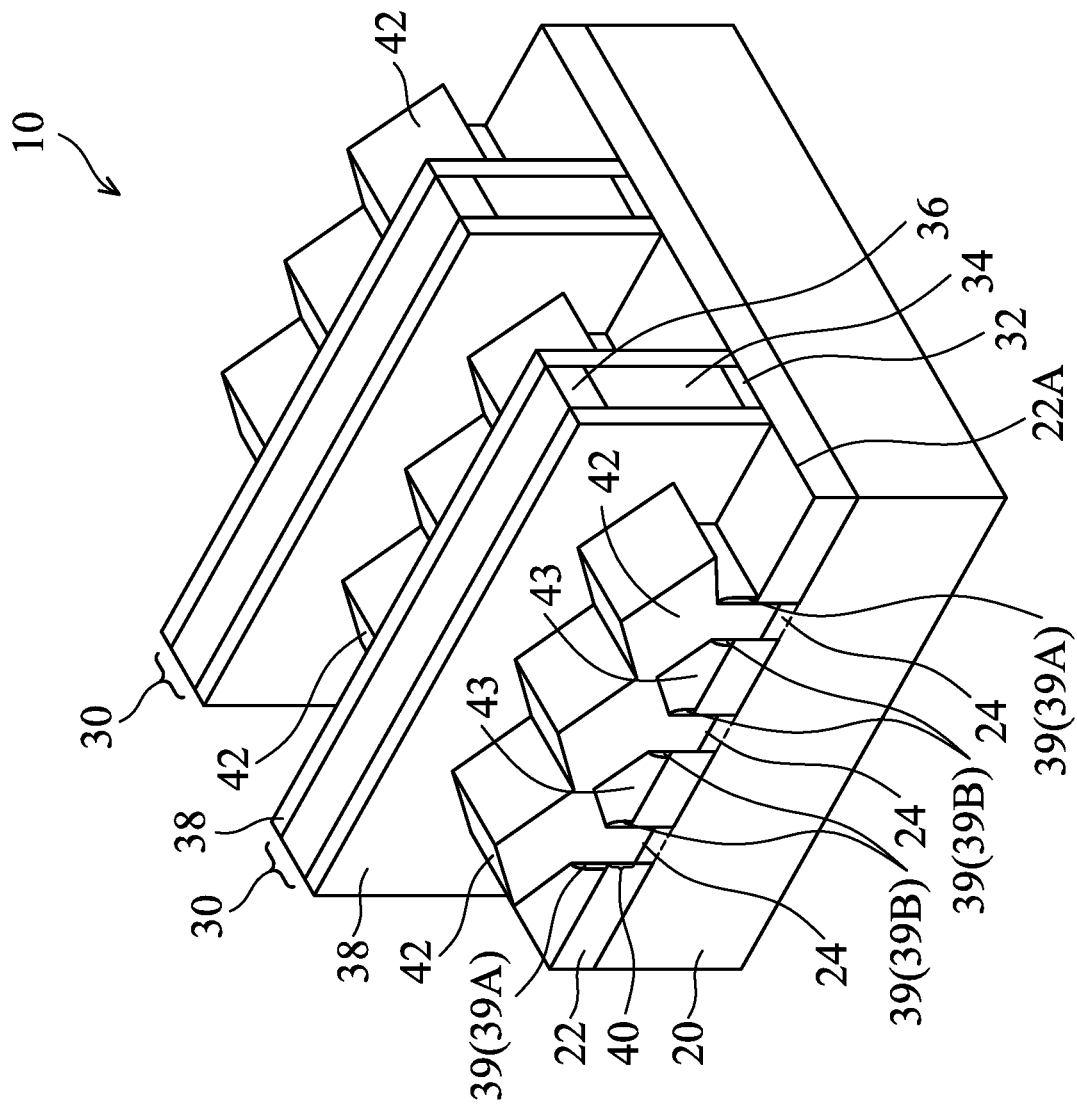
Figure 9:
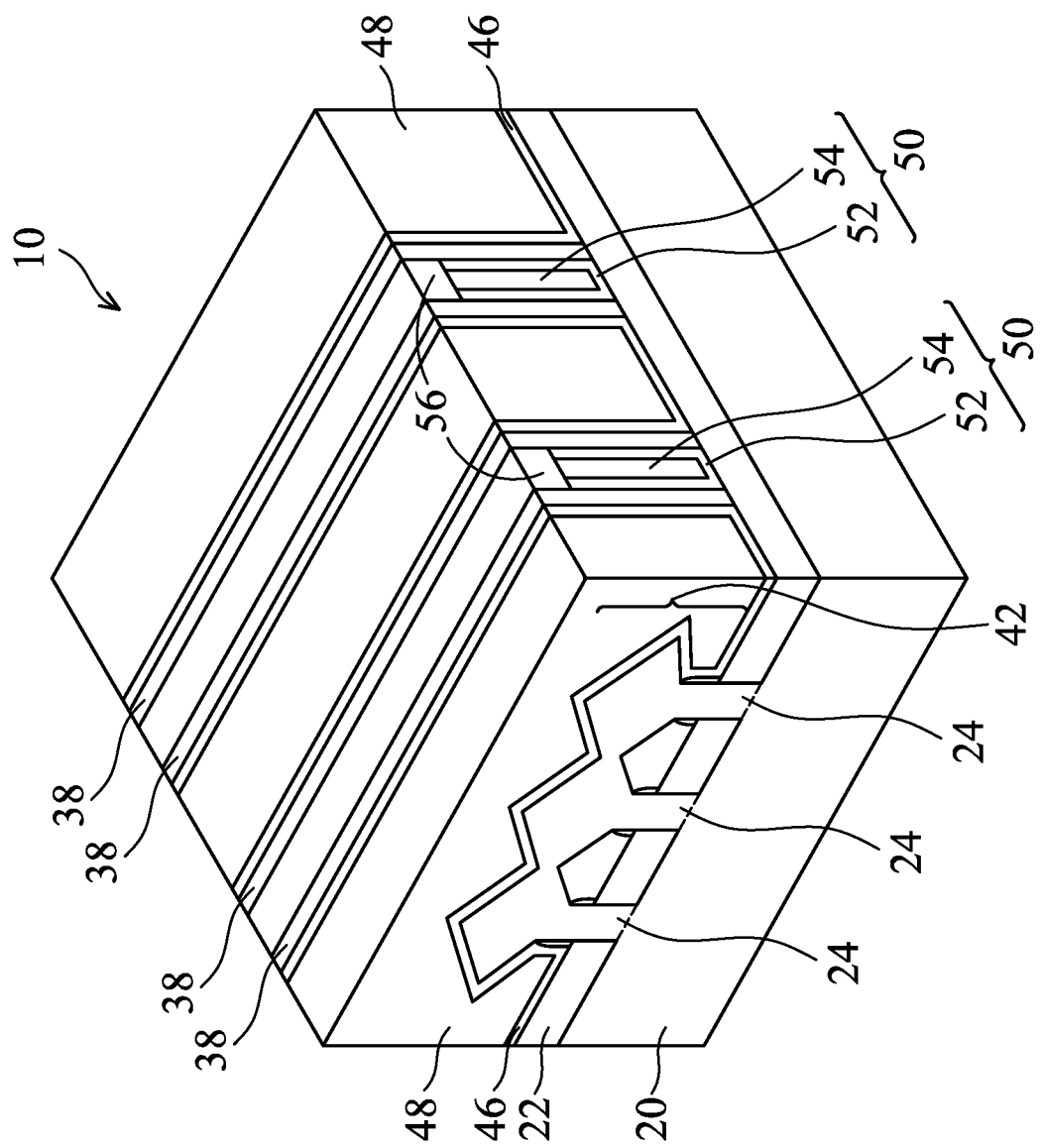

FIG. 8 illustrates a perspective view of the structure shown in FIG. 7. FIG. 9 illustrates a perspective view of the structure after the formation of Contact Etch Stop Layer (CESL) 46 and Inter-Layer Dielectric (ILD) 48. The respective process is illustrated as process 214 in the process flow shown in FIG. 13. CESL 46 may be formed of silicon nitride, silicon carbo-nitride, or the like. In accordance with some embodiments of the present disclosure, CESL 46 is formed using a conformal deposition method such as ALD or CVD. ILD 48 may include a dielectric material formed using, for example, Flowable Chemical Vapor Deposition (FCVD), spin-on coating, CVD, or another deposition method. ILD 48 may also be formed of an oxygen-containing dielectric material, which may be a silicon-oxide based material such as Tetra Ethyl Ortho Silicate (TEOS) oxide, a PECVD oxide ($SiO_2$), Phospho-Silicate Glass (PSG), Boro-Silicate Glass (BSG), Boron-Doped Phospho-Silicate Glass (BPSG), or the like. A planarization process such as a Chemical Mechanical Polish (CMP) process or a mechanical grinding process may be performed to level the top surfaces of ILD 48 and gate spacers 38 with each other.

FIG. 9 also illustrates the formation of replacement gates 50. The respective process is illustrated as process 216 in the process flow shown in FIG. 13. The formation process includes removing the remaining portions of dummy gate stack 30 (FIG. 8) to form trenches, and forming replacement gates 50 in the resulting trenches. Replacement gates 50 include gate dielectrics 52 and metal gate electrodes 54. In accordance with some embodiments of the present disclosure, each of gate dielectrics 52 includes an Interfacial Layer (IL, not shown separately) as its lower part. The IL is formed on the exposed surfaces of protruding fins 24'. The IL may include an oxide layer such as a silicon oxide layer, which is formed through the thermal oxidation of protruding fins 24' (not shown in FIG. 8), a chemical oxidation process, or a deposition process. Gate dielectrics 52 may also include a high-k dielectric layer (not shown separately) formed over The IL. The high-k dielectric layer may include a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0. The high-k dielectric layer is overlying, and may contact, The IL. The high-k dielectric layer may be formed as a conformal layer, and extends on the sidewalls of protruding fins 24' and the sidewalls of gate spacers 38. In accordance with some embodiments of the present disclosure, the high-k dielectric layer is formed using ALD or CVD.

Gate electrode 54 may include a diffusion barrier layer and one (or more) work-function layer over the diffusion barrier layer. The diffusion barrier layer may be formed of titanium nitride (TiN), which may (or may not) be doped with silicon. The work-function layer determines the work function of the gate, and includes at least one layer, or a plurality of layers formed of different materials. The material of the work-function layer may include a TaN layer and a titanium aluminum (TiAl) layer over the TaN layer, for example. After the deposition of the work-function layer(s), another barrier layer, which may be another TiN layer, is formed. A filling metal such as tungsten or cobalt may fill the remaining trenches left by the removed dummy gates. A planarization process may then be performed to remove excess portions of the diffusion barrier layer, the work function layer, the filling metal, etc. to form gate electrodes 54.

As also shown in FIG. 9, hard masks 56 are formed over gate stacks 50 and between gate spacers 38. Hard mask 56 may be formed of silicon nitride, silicon carbide, silicon carbo-nitride, silicon oxy-carbo-nitride, or the like. The formation of hard masks 56 may include recessing replacement gate stacks 50, filling the resulting recesses with a dielectric material, and preforming a planarization process to remove excesses portions of the dielectric material.

Figure 10A:
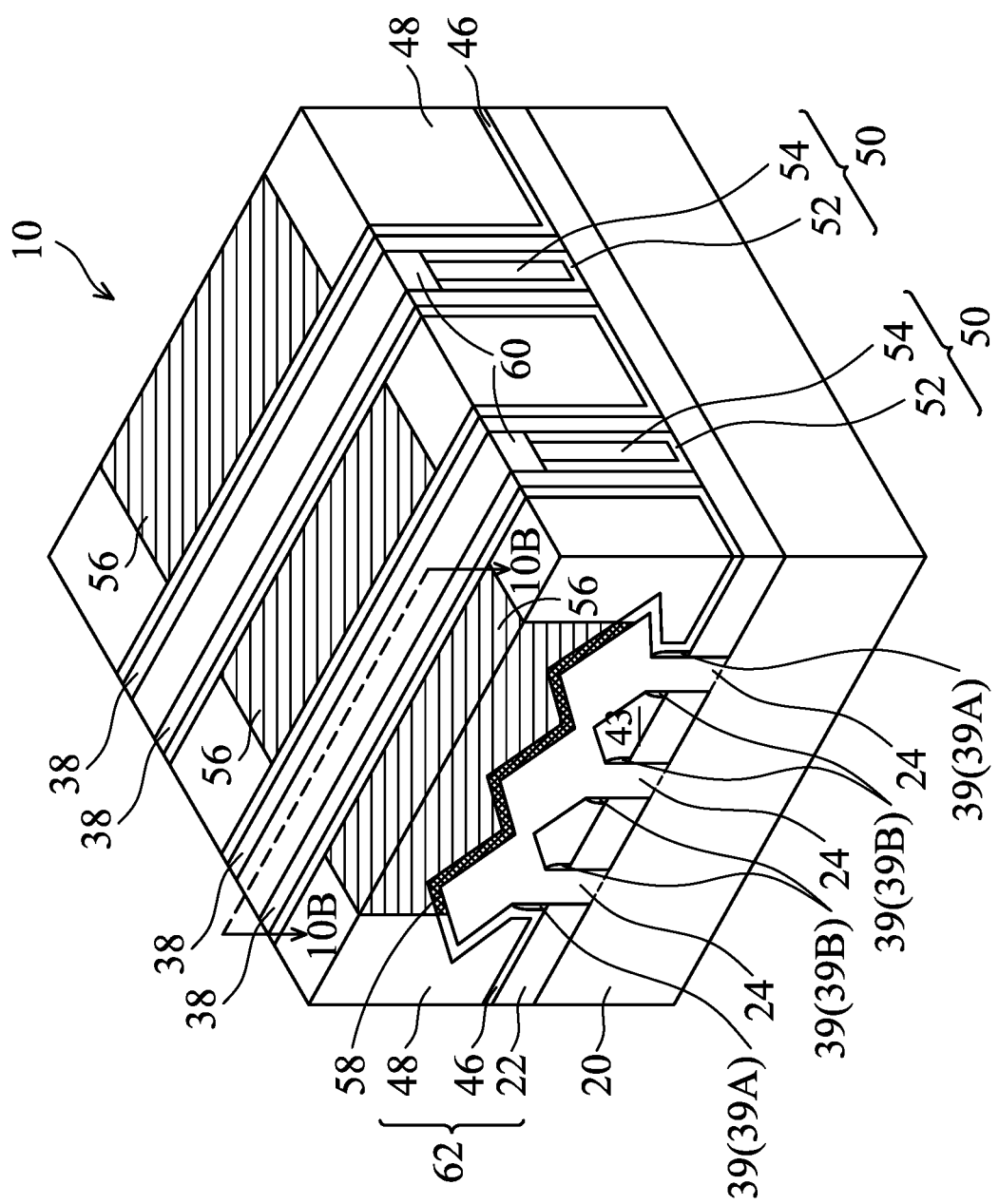

Referring to FIG. 10A, some portions of ILD 48 and CESL 46 are removed to form contact openings (occupied by contact plugs 60), followed by siliciding the exposed portions of source/drain regions 42 to form source/drain silicide regions 58. The respective process is illustrated as process 218 in the process flow shown in FIG. 13. A conductive material such as tungsten is filled into the contact openings to form source/drain contact plugs 60. The respective process is illustrated as process 220 in the process flow shown in FIG. 13. FinFET 62 and the corresponding source/drain contact plugs are thus formed. In accordance with some embodiments of the present disclosure, as shown in FIG. 10, source/drain regions 42 formed based on different fins are merged. In accordance with other embodiments of the present disclosure, the source/drain regions formed based on different fins remain separated from each other.

Figure 10B:
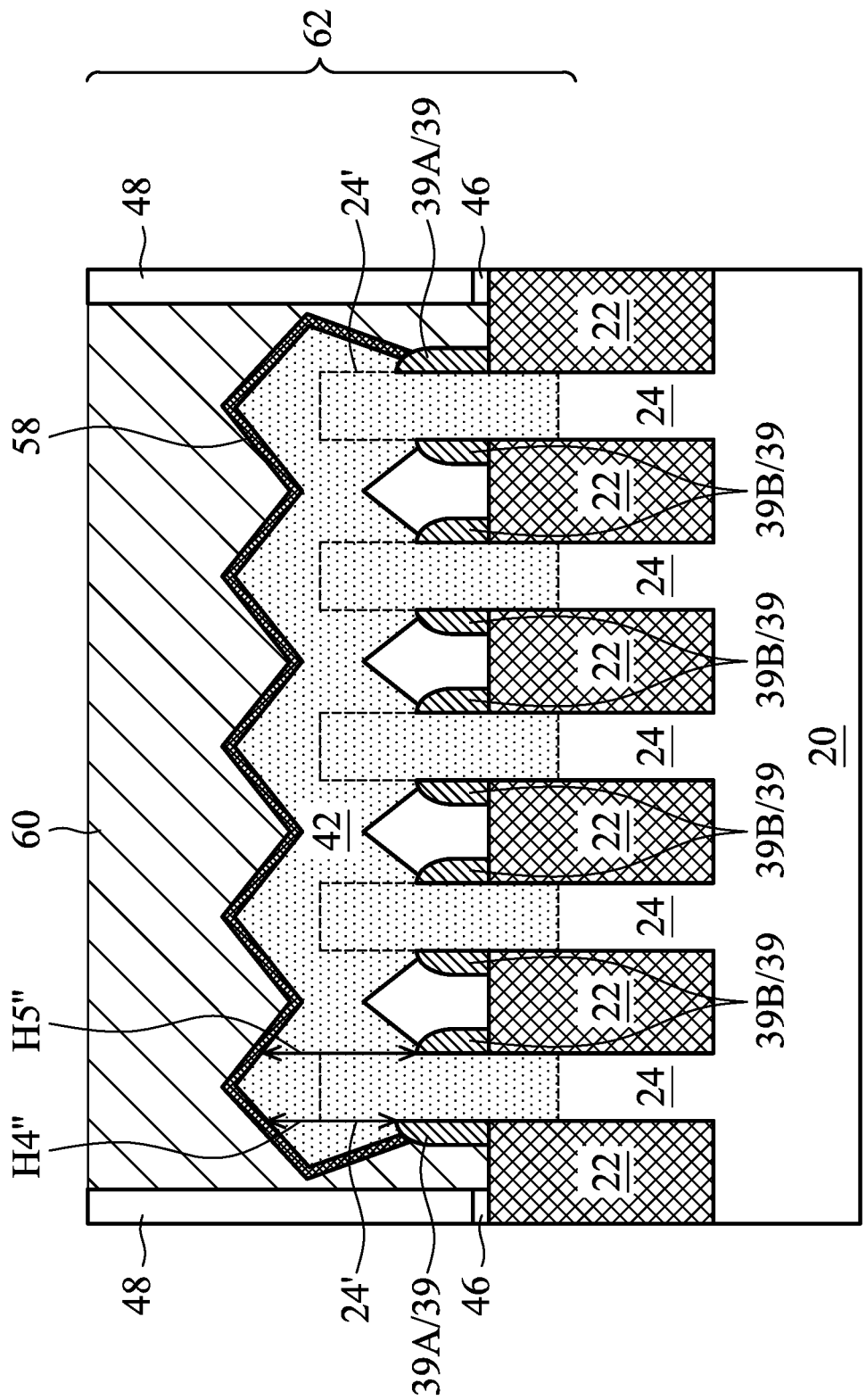
FIG. 10B illustrates a cross-sectional view of a FinFET having merged epitaxy regions in accordance with some embodiments.

FIG. 10B illustrates a cross-sectional view of the structure shown in FIG. 10A, wherein the structure shown in FIG. 10B is obtained from the vertical plane containing line 10B-10B in FIG. 10A. The corresponding outer height and inner height of epitaxy regions 42 are referred to as H4" and H5‴. In accordance with some embodiments, height H5‴ is greater than height H4‴. Height difference (H5‴−H4‴) may be greater than about 2 nm, and may be in the range between about 2 nm and about 8 nm.

Figure 11:
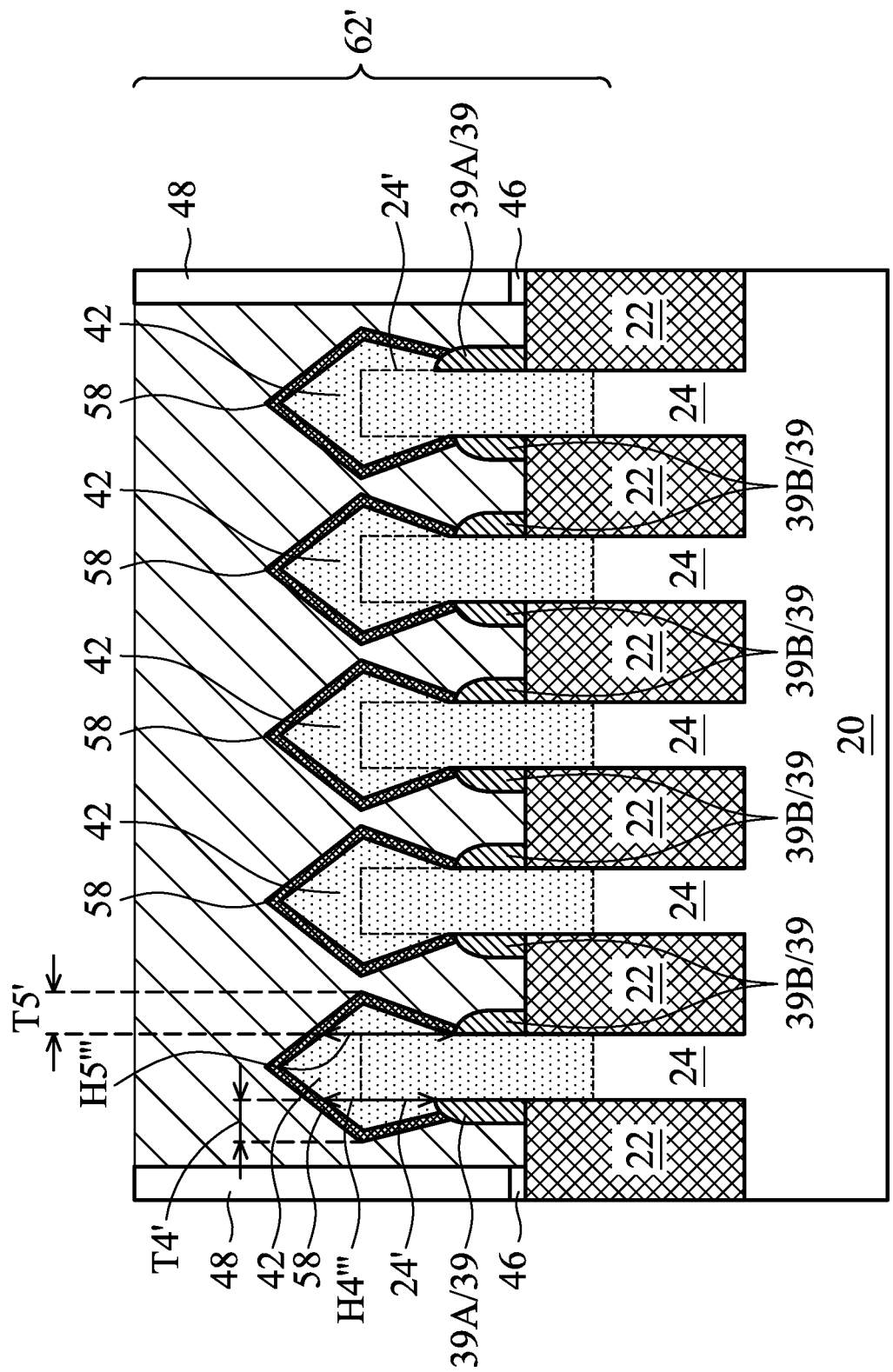
FIG. 11 illustrates the cross-sectional view of a FinFET having non-merged epitaxy regions in accordance with some embodiments.

FIG. 11 illustrates a cross-sectional view of FinFET 62′ having un-merged epitaxy regions 42. The corresponding outer height and inner height of epitaxy regions 42 are referred to as H4‴ and H5‴, respectively. In accordance with some embodiments, height H5‴ is greater than height H4‴. Height difference (H5‴−H4‴) may be greater than about 2 nm, and may be in the range between about 2 nm and about 10 nm. Also, thickness T4′ of the portions of epitaxy regions 42 grown from the outer sidewall surfaces of protruding fins 24′ is smaller than thickness T5′ of the portions of epitaxy regions 42 grown from the inner sidewall surfaces of protruding fins 24′. Thickness difference (T5′−T4′) may be in the range between about greater than about 2 nm, and may be in the range between about 2 nm and about 10 nm. It is appreciated that the FinFET 62 shown in FIGS. 10A and 10B may coexist with the FinFET 62′ shown in FIG. 11 on the same die and the same wafer.

FIG. 12 illustrates the FinFET 62″ in which protruding fins 24′ are not etched, and epitaxy regions (source/drain regions) 42′ are formed based on un-etched protruding fins 24′. In accordance with some embodiments of the present disclosure, FinFET 62″ is an n-type FinFET, and the corresponding epitaxy regions 42′ are of n-type, and may be formed of SiP, SiCP, Si, or the like. Also, rather than having substantially straight facets, epitaxy regions 42′ may have rounded outer surface. The corresponding outer height (measured from a top surface of the outer fin spacer 39A) and inner height (measured from a top surface of the inner fin spacer 39B) of epitaxy regions 42′ are referred to as H6 and H7, respective. In accordance with some embodiments, height H7 is greater than height H6. Height difference (H7-H6) may be greater than about 2 nm, and may be in the range between about 2 nm and about 10 nm.

The embodiments of the present disclosure have some advantageous features. By controlling the etching process for forming fin spacers, the inner-group portions of epitaxy regions have greater heights than the outer portions of the epitaxy regions. This results in the increased volume of epitaxy regions, and results in increased strain to be generated by the epitaxy regions. Also, the likelihood of the bridging of epitaxy regions is reduced.

In accordance with some embodiments of the present disclosure, a method includes forming isolation regions over a bulk semiconductor substrate; recessing the isolation regions, wherein top portions of semiconductor strips between the isolation regions protrude higher than top surfaces of the isolation regions to form a fin group, and the fin group includes a plurality of inner fins; and a first outer fin and a second outer fin on opposite sides of the plurality of inner fins; and forming fin spacers on sidewalls of the plurality of inner fins, the first outer fin, and the second outer fin, wherein the fin spacers comprise an outer fin spacer on an outer sidewall of the first outer fin, wherein the outer sidewall faces away from the fin group, and the outer fin spacer has a first height; and an inner fin spacer on an inner sidewall of the first outer fin, wherein the inner sidewall faces toward the plurality of inner fins, and the inner fin spacer has a second height smaller than the first height. In an embodiment, the first height is greater than the second height by a height difference greater than about 2 nm. In an embodiment, the outer fin spacer and the inner fin spacer are formed in a common process. In an embodiment, the method further comprises forming a gate stack, wherein the gate stack extends on sidewalls and a top surface of each of the plurality of inner fins, the first outer fin, and the second outer fin. In an embodiment, the method further comprises forming a gate spacer on sidewalls of the gate stack, wherein the gate spacer and the fin spacers are formed in a common formation process. In an embodiment, the method further comprises epitaxially growing epitaxy regions based on the plurality of inner fins, the first outer fin, and the second outer fin, wherein a third height of the epitaxy regions measured directly over the outer fin spacer is smaller than a fourth height of the epitaxy regions measured directly over the inner fin spacer. In an embodiment, the fourth height is greater than the third height by a height difference greater than about 2 nm. In an embodiment, the epitaxially growing epitaxy regions comprise pulsing a bias voltage with a plurality of cycles. In an embodiment, the pulsing has a duty cycle in a range between about 10 percent and about 90 percent.

In accordance with some embodiments of the present disclosure, a method includes forming a gate stack on a plurality of semiconductor fins, wherein the plurality of semiconductor fins comprise: a plurality of inner fins; and a first outer fin and a second outer fin on opposite sides of the plurality of inner fins; and epitaxially growing epitaxy regions based on the plurality of semiconductor fins, wherein a first height of the epitaxy regions measured along an outer sidewall of the first outer fin is smaller than a second height of the epitaxy regions measured along an inner sidewall of the first outer fin. In an embodiment, a difference between the first height and the second height is greater than about 2 nm. In an embodiment, the epitaxy regions formed based on the plurality of semiconductor fins are merged. In an embodiment, the epitaxy regions formed based on the plurality of semiconductor fins are un-merged. In an embodiment, the method further includes forming gate spacers on sidewalls of the gate stack; and in a same process for forming the gate spacers, forming fin spacers on sidewalls of the plurality of semiconductor fins, wherein the fin spacers comprise: a first outer fin spacer and a second outer fin spacer, wherein the first outer fin spacer and the second outer fin spacer have a third height; and an inner fin spacer between the first outer fin spacer and the second outer fin spacer, wherein the inner fin spacer has a fourth height smaller than the third height. In an embodiment, a difference between the third height and the fourth height is greater than about 2 nm.

In accordance with some embodiments of the present disclosure, a device includes a plurality of semiconductor fins, wherein the plurality of semiconductor fins comprise: a plurality of inner fins; and a first outer fin and a second outer fin on opposite sides of the plurality of inner fins; a gate stack on a sidewall and top surfaces of the plurality of semiconductor fins; fin spacers on a side of the gate stack, wherein the fin spacers comprise: a first outer fin spacer and a second outer fin spacer, wherein the first outer fin spacer and the second outer fin spacer have a first height; and an inner fin spacer between the first outer fin spacer and the second outer fin spacer, wherein the inner fin spacer has a second height smaller than the first height; and semiconductor regions extending into spaces between each pair of the fin spacers. In an embodiment, a difference between the first height and the second height is greater than about 2 nm. In an embodiment, the device further includes a gate spacer on a sidewall of the gate stack, wherein the fin spacers are continuously connected to the gate spacer. In an embodiment, a third height of the semiconductor regions measured directly over the first outer fin spacer is smaller than a fourth height of the semiconductor regions measured directly over the inner fin spacer. In an embodiment, the semiconductor regions are merged into a continuous semiconductor region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming isolation regions over a bulk semiconductor substrate;
   recessing the isolation regions, wherein top portions of semiconductor strips between the isolation regions protrude higher than top surfaces of the isolation regions to form a fin group, and the fin group comprising:
      a plurality of inner fins; and
      a first outer fin and a second outer fin on opposite sides of the plurality of inner fins;
   forming fin spacers on sidewalls of the plurality of inner fins, the first outer fin, and the second outer fin, wherein the fin spacers comprise:
      an outer fin spacer on an outer sidewall of the first outer fin, wherein the outer sidewall faces away from the fin group, and the outer fin spacer has a first height; and
      an inner fin spacer on an inner sidewall of the first outer fin, wherein the inner sidewall faces toward the plurality of inner fins, and the inner fin spacer has a second height smaller than the first height; and
   epitaxially growing epitaxy regions based on the plurality of inner fins, the first outer fin, and the second outer fin, wherein the epitaxially growing epitaxy regions comprises pulsing a bias voltage with a plurality of cycles.

2. The method of claim 1, wherein the first height is greater than the second height by a height difference greater than about 2 nm.

3. The method of claim 1, wherein the outer fin spacer and the inner fin spacer are formed in a common process.

4. The method of claim 1 further comprising forming a gate stack, wherein the gate stack extends on sidewalls and a top surface of each of the plurality of inner fins, the first outer fin, and the second outer fin.

5. The method of claim 4 further comprising forming a gate spacer on sidewalls of the gate stack, wherein the gate spacer and the fin spacers are formed in a common formation process.

6. The method of claim 1, wherein a third height of the epitaxy regions measured directly over the outer fin spacer is smaller than a fourth height of the epitaxy regions measured directly over the inner fin spacer.

7. The method of claim 6, wherein the fourth height is greater than the third height by a height difference greater than about 2 nm.

8. The method of claim 1, wherein the pulsing has a duty cycle in a range between about 10 percent and about 90 percent.

9. A method comprising:
   forming isolation regions extending into a semiconductor substrate;
   forming a plurality of semiconductor fins protruding higher than the isolation regions, wherein the plurality of semiconductor fins comprise:
      a plurality of inner fins; and
      a first outer fin and a second outer fin on opposite sides of the plurality of inner fins;
   forming fin spacers on sidewalls of the plurality of semiconductor fins, wherein the forming the fin spacers comprises:
      depositing a spacer layer on top surfaces and sidewalls of the plurality of semiconductor fins;
      performing a first etching process to thin the spacer layer;
      removing a first polymer generated in the first etching process;
      after the first polymer is removed, performing a second etching process to etch the spacer layer; and
      removing a second polymer generated in the second etching process, and wherein the fin spacers comprise:
         a first outer fin spacer and a second outer fin spacer having a third height, wherein the first outer fin spacer is vertical, and comprises an inner sidewall contacting the first outer fin, and an outer sidewall opposing the inner sidewall, wherein each of the inner sidewall and the outer sidewall extends to contact a top surface of a portion of the isolation regions; and
         an inner fin spacer between the first outer fin spacer and the second outer fin spacer, wherein the inner fin spacer has a fourth height smaller than the third height; and
   epitaxially growing epitaxy regions based on the plurality of semiconductor fins, wherein a first height of the epitaxy regions measured along an outer sidewall of the first outer fin is smaller than a second height of the epitaxy regions measured along the inner sidewall of the first outer fin.

10. The method of claim 9, wherein a difference between the first height and the second height is greater than about 2 nm.

11. The method of claim 9, wherein the epitaxy regions formed based on the plurality of semiconductor fins is merged.

12. The method of claim 9, wherein the epitaxy regions formed based on the plurality of semiconductor fins is un-merged.

13. The method of claim 10, wherein a difference between the third height and the fourth height is greater than about 2 nm.

14. The method of claim 9 further comprising, before the epitaxially growing epitaxy regions, recessing the plurality of semiconductor fins to form recesses, wherein bottoms of the recesses are lower than bottoms of the isolation regions.

15. A method comprising:
   depositing a spacer layer on top surfaces and sidewalls of a plurality of protruding fins, wherein the plurality of protruding fins comprise:
      a plurality of inner fins; and
      a first outer fin and a second outer fin on opposing sides the plurality of inner fins;

etching the spacer layer to form fin spacers on sidewalls of the plurality of protruding fins, wherein the fin spacers comprise:
- a first fin spacer on a first sidewall of the first outer fin, wherein the first fin spacer has a first height; and
- a second fin spacer on a second sidewall of the first outer fin, wherein the second fin spacer has a second height smaller than the first height, wherein the etching the spacer layer comprises performing a plurality of cycles, each comprising:
  - performing an etching process to etch the spacer layer; and
  - after the etching process, removing a polymer generated in the etching process.

16. The method of claim 15, wherein the first sidewall faces away from the plurality of protruding fins, and the second sidewall faces toward the plurality of inner fins.

17. The method of claim 15, wherein the first height is greater than the second height by a height difference greater than about 2 nm.

18. The method of claim 15, wherein the first fin spacer and the second fin spacer are formed in a same etching process.

19. The method of claim 15 further comprising forming a gate stack on the plurality of protruding fins.

20. The method of claim 15, wherein at a time the etching the spacer layer is started, a portion of the spacer layer covers a portion of an isolation region, and the portion of the spacer layer extends from the first outer fin to a third outer fin, and wherein at the time, all top surfaces of the portion of the spacer layer are exposed to a corresponding etching chemical used for the etching the spacer layer.

* * * * *